US009478551B2

(12) United States Patent
Kim et al.

(10) Patent No.: US 9,478,551 B2
(45) Date of Patent: Oct. 25, 2016

(54) SEMICONDUCTOR DEVICES AND METHODS OF MANUFACTURING THE SAME

(71) Applicant: SAMSUNG ELECTRONICS CO., LTD., Suwon-si, Gyeonggi-do (KR)

(72) Inventors: Young-Hun Kim, Seoul (KR); Ju-Youn Kim, Suwon-si (KR); Koung-Min Ryu, Hwaseong-si (KR); Jong-Mil Youn, Yongin-si (KR); Jong-Ho Lee, Hwaseong-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 60 days.

(21) Appl. No.: 14/081,543

(22) Filed: Nov. 15, 2013

(65) Prior Publication Data
US 2014/0167177 A1 Jun. 19, 2014

(30) Foreign Application Priority Data

Dec. 13, 2012 (KR) .................. 10-2012-0145232

(51) Int. Cl.
*H01L 21/70* (2006.01)
*H01L 29/76* (2006.01)
*H01L 27/11* (2006.01)
*H01L 21/8238* (2006.01)
*H01L 27/092* (2006.01)

(52) U.S. Cl.
CPC ... *H01L 27/1104* (2013.01); *H01L 21/823807* (2013.01); *H01L 27/092* (2013.01)

(58) Field of Classification Search
USPC ................................. 257/288, 369
See application file for complete search history.

(56) References Cited

U.S. PATENT DOCUMENTS

| 6,268,629 | B1 | 7/2001 | Noguchi |
| 6,548,866 | B2* | 4/2003 | Noguchi ........... H01L 21/76232 257/345 |
| 6,624,019 | B2* | 9/2003 | Kim .................. H01L 21/8238 257/E21.632 |
| 6,703,271 | B2 | 3/2004 | Yeo et al. |
| 7,105,908 | B2 | 9/2006 | Lee et al. |
| 7,485,525 | B2 | 2/2009 | Cheng et al. |
| 7,525,141 | B1 | 4/2009 | Forbes |
| 7,718,496 | B2 | 5/2010 | Frank et al. |
| 7,932,143 | B1 | 4/2011 | Pal et al. |
| 8,217,463 | B2 | 7/2012 | Pal et al. |
| 8,232,186 | B2 | 7/2012 | Harley et al. |
| 2008/0079086 | A1 | 4/2008 | Jung et al. |
| 2011/0095341 | A1 | 4/2011 | Pal et al. |
| 2011/0175141 | A1 | 7/2011 | Lim et al. |
| 2012/0133000 | A1 | 5/2012 | Anderson et al. |
| 2012/0139033 | A1 | 6/2012 | Yamasaki et al. |
| 2012/0161249 | A1 | 6/2012 | Kronholz et al. |

FOREIGN PATENT DOCUMENTS

| JP | 2004-165197 | 6/2004 |
| JP | 2011-040578 | 2/2011 |

* cited by examiner

*Primary Examiner* — Marc Armand
*Assistant Examiner* — Wilner Jean Baptiste
(74) *Attorney, Agent, or Firm* — Lee & Morse, P.C.

(57) ABSTRACT

A semiconductor device includes a channel layer over an active region, first and second field regions adjacent the active region, and a gate structure over the channel layer and portions of the first and second field regions. The first and second field regions include grooves adjacent respective sidewalls of the channel layer, and bottom surfaces of the grooves are below a bottom surface of the channel layer.

20 Claims, 45 Drawing Sheets

FIG. 18 (COMPARATIVE EXAMPLE)

SEMICONDUCTOR DEVICES AND METHODS OF MANUFACTURING THE SAME

CROSS-REFERENCE TO RELATED APPLICATION

Korean Patent Application No. 10-2012-0145232, filed on Dec. 13, 2012, and entitled: "Semiconductor Devices and Methods of Manufacturing the Same," is incorporated by reference herein in its entirety.

BACKGROUND

1. Field

One or more embodiments described herein relate to semiconductor devices.

2. Description of the Related Art

In a process of manufacturing a SRAM device, a silicon-germanium layer for channel may be formed on an active region of a PMOS region so as to control the threshold voltage of the SRAM device. Thus, a hard mask covering an NMOS region and exposing a PMOS region may be formed on a silicon substrate and an isolation layer, and a silicon-germanium layer for channel may be formed on an active region of the exposed PMOS region.

SUMMARY

In accordance with one embodiment, a method of manufacturing a semiconductor device includes partially etching an active region of a substrate and an isolation layer on the substrate to form a recess and a groove, respectively, the active region corresponding to the isolation layer, and the groove in fluid communication with the recess and having a bottom surface lower than a bottom surface of the recess; forming a channel layer in the recess on the active region of the substrate; and forming a gate structure over the channel layer.

Forming the recess and the groove may include forming a mask to partially expose the active region and isolation layer; and etching portions of the active region and isolation layer not covered by the mask. Also, the substrate may includes silicon, the isolation layer and the mask may include silicon oxide, and the etching may be performed using hydrofluoric acid (HF) as an etching solution. The method may also include removing the mask after forming the channel layer.

Forming the mask may include sequentially forming a silicon oxide layer and a silicon nitride layer on the substrate and the isolation layer; forming a photoresist pattern on the silicon nitride layer; patterning the silicon nitride layer using the photoresist pattern to form a silicon nitride pattern; and patterning the silicon oxide layer using the silicon nitride layer pattern to form a silicon oxide layer pattern serving as the etch mask. The substrate may include silicon, and the channel layer may be formed to include silicon-germanium.

The channel layer may have a top surface substantially coplanar with a top surface of at least one of a portion of the active region not etched or a top surface of a portion of the isolation layer not etched.

Forming the gate structure may include forming a gate insulation layer pattern, a work function control layer pattern, and a doped polysilicon layer pattern that are sequentially stacked to cover a top surface and a sidewall of the channel layer. The active region may include a PMOS region and an NMOS region, and forming the recess and groove may include partially etching the active region in the PMOS region and the isolation layer adjacent thereto.

Forming the gate structure may include sequentially forming a gate insulation layer and a first work function control layer on the channel layer, the isolation layer, and the NMOS region; patterning the first work function control layer to form a first work function control layer pattern overlapping the channel layer and at least a portion of the isolation layer adjacent to the channel layer; sequentially forming a second work function control layer and a doped polysilicon layer on the first work function control layer pattern and the gate insulation layer; and patterning the doped polysilicon layer, the second work function control layer, the first work function control layer pattern, and the gate insulation layer to form a gate insulation layer pattern, the first function control layer pattern, a second work function control layer pattern, and a doped polysilicon layer that are sequentially stacked on and overlap the channel layer and the at least a portion of the isolation layer adjacent to the channel layer, and to form the gate insulation layer pattern, the second function control layer pattern, and the doped polysilicon layer pattern that are sequentially stacked on and overlap the NMOS region.

In accordance with another embodiment, a semiconductor device includes a substrate including a PMOS region and an NMOS region corresponding to respective active regions, an isolation layer pattern between the PMOS and NMOS regions; a silicon-germanium channel layer on the active region in the PMOS region; a first gate structure over a top surface and at least one sidewall of the silicon-germanium channel layer and on a portion of the isolation layer pattern adjacent to the silicon-germanium channel layer, the first gate structure included on a groove having a bottom surface, at least a portion of the bottom surface lower than a bottom surface of the silicon-germanium channel layer; and a second gate structure on the active region in the NMOS region.

The top surface of the silicon-germanium channel layer may be substantially flat and substantially coplanar with a top surface of the active region in the NMOS region.

The first gate structure may include a gate insulation layer pattern, a first work function control layer pattern, a second work function control layer pattern, and a doped polysilicon layer sequentially stacked; and the second gate structure may include the gate insulation layer pattern, the second work function control layer pattern, and the doped polysilicon layer sequentially stacked.

The gate insulation layer pattern may include a low-k dielectric layer pattern and a high-k dielectric layer pattern sequentially stacked; the first work function control layer pattern may include a first metal nitride layer pattern, a first metal layer pattern, and a second metal nitride layer pattern sequentially stacked; and the second work function control layer pattern may include a second metal layer pattern and a third metal nitride layer pattern sequentially stacked. The first gate structure may be in a pull-up transistor of a SRAM device, and the second gate structure may be in a pull-down transistor or a pass-gate transistor of the SRAM device.

In accordance with another embodiment, a semiconductor device includes a first active region; a channel layer over the first active region; first and second field regions adjacent the first active region; and a first gate structure over the channel layer and portions of the first and second field regions, wherein the first and second field regions include grooves adjacent respective sidewalls of the channel layer and wherein bottom surfaces of the grooves are below a bottom surface of the channel layer.

The device may further include a second gate structure adjacent the first gate structure, wherein the second gate structure is over a second active region, and wherein the first gate structure corresponds to a first transistor of a first conductivity type and the second gate structure corresponds to a second transistor of a second conductivity type, the first field region between the first and second transistors. Also, an entire bottom surface of the second gate structure may be above a top surface of the first field region.

The device may further include a second gate structure adjacent the first gate structure, wherein the first and second gate structures corresponds to transistors of a same conductivity type, and wherein the first field region includes a portion of the first gate structure and a portion of the second gate structure coupled to the first gate structure. Also, each of the first and second field regions may include isolation regions.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
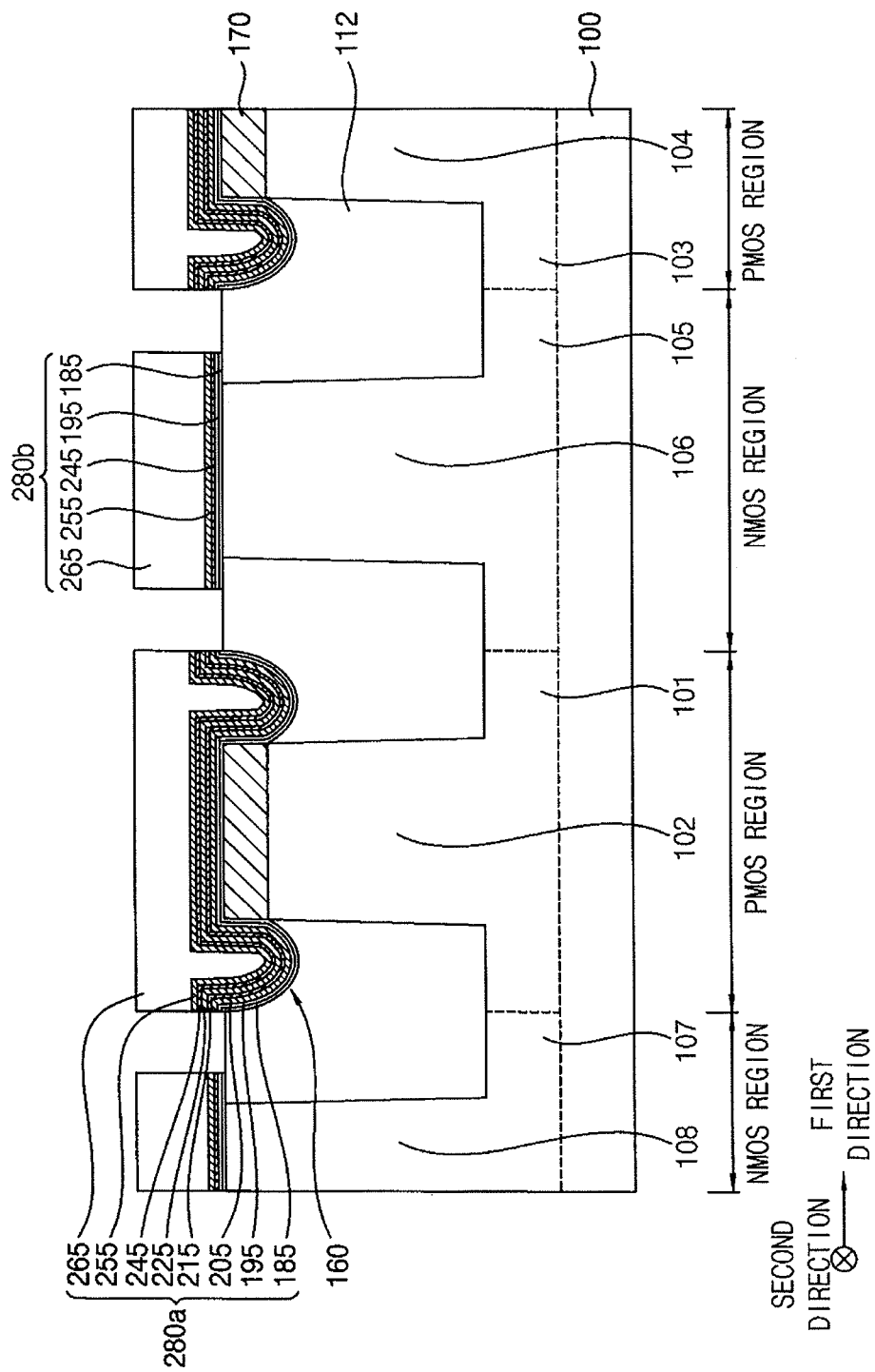
FIGS. 1-3 illustrate an embodiment of a semiconductor device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
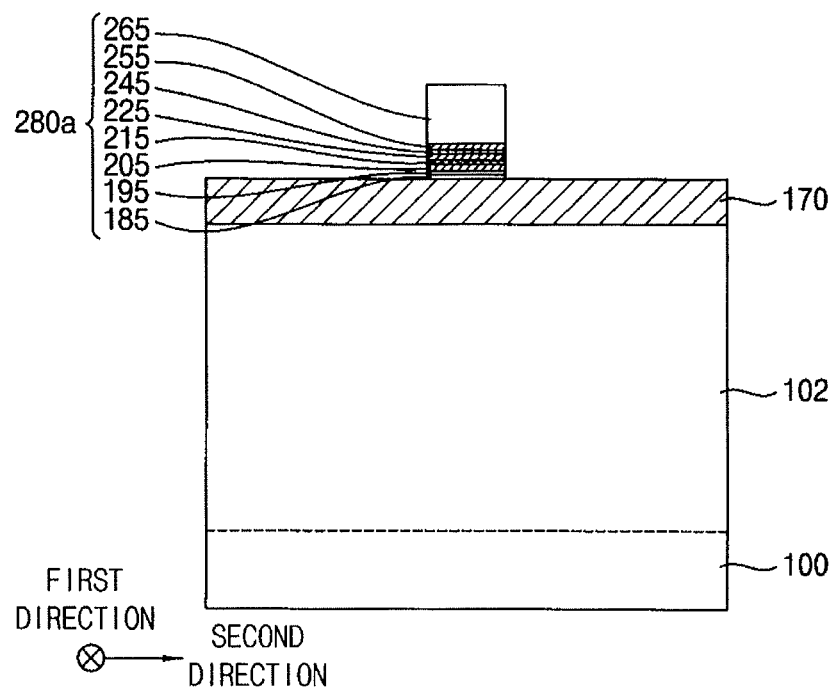
Figure 3:
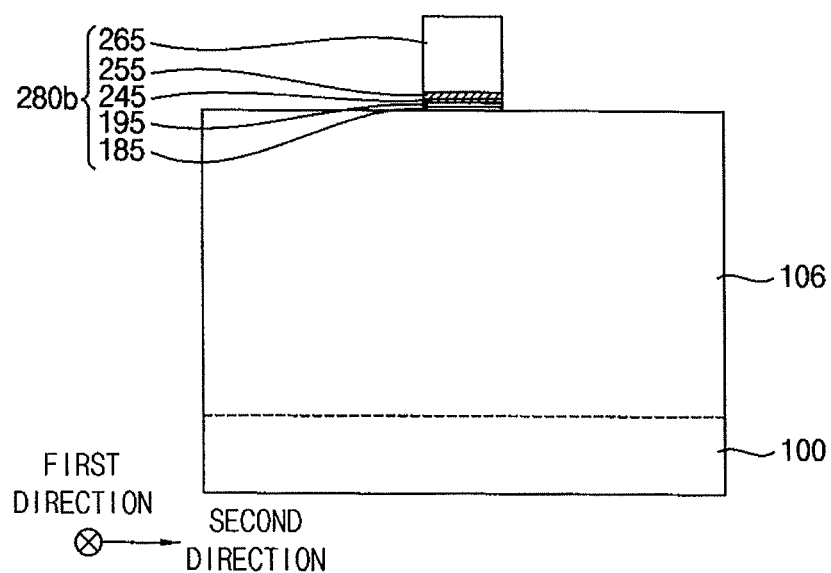

FIGS. 1 to 3 illustrate an embodiment of a semiconductor device. More specifically, FIG. 1 illustrates a cross-sectional view of the semiconductor device cut along a first direction, FIG. 2 illustrates a cross-sectional view of the semiconductor device cut along a second direction substantially perpendicular to the first direction in a PMOS region, and FIG. 3 illustrates a cross-sectional view of the semiconductor device cut along the second direction in an NMOS region.

Referring to FIGS. 1 to 3, the semiconductor device may include a substrate 100 having a positive channel metal oxide semiconductor (PMOS) region and a negative channel metal oxide semiconductor (NMOS) region and active regions 102, 104, 106 and 108 defined by an isolation layer pattern 112 thereon. The device may also include a channel layer 170 on the active regions 102 and 104 of the PMOS region, a first gate structure 280a, and a second gate structure 280b. The first gate structure 280a covers a top surface and a sidewall of the channel layer 170 and is formed on a groove 160 on the isolation layer pattern 112 adjacent to the channel layer 170. The second gate structure 280b is formed on the active regions 106 and 108 of the NMOS region. Gate spacers may be further formed on sidewalls of the gate structures, respectively.

The substrate 100 may include a semiconductor substrate, e.g. a silicon substrate, a germanium substrate and a silicon-germanium substrate, a silicon-on-insulator (SOI) substrate, a germanium-on-insulator (GOI) substrate, etc. A substrate 100 region where the isolation layer pattern 112 is formed may be defined as a field region and a region where the isolation layer pattern 112 is not formed may be defined as the active region.

In example embodiments, a plurality of active regions 108, 102, 106 and 104 may be formed on the substrate 100 along the first direction. Each of the active regions 102, 104, 106 and 108 may extend in a second direction substantially perpendicular to the first direction. In example embodiments, reference numerals 102, 104, 106, and 108 may indicate first, second, third and fourth active regions, respectively, and the arrangement order of the active regions 102, 104, 106 and 108 in the first direction may not be limited thereto. As the isolation layer pattern 112 is formed partially on the substrate 100, each upper portion of the active regions 102, 104, 106, and 108 may protrude from the substrate 100 in a vertical direction. The isolation layer pattern 112 may include e.g. silicon oxide.

Wells 101, 103, 105 and 107 doped with p-type impurities or n-type impurities may be formed in the substrate 100. Particularly, the first and second wells 101 and 103 may be n-type wells doped with n-type impurities, and the third and fourth wells 105 and 107 may be p-type wells doped with p-type impurities. Thus, the substrate 100 may include PMOS regions where n-type wells 101 and 103 are formed and an NMOS region where p-type wells 105 and 107 are formed. In example embodiments, the first to fourth active regions 102, 104, 106 and 108 may be defined in the first to fourth wells 101, 103, 105, and 107, respectively, and thus may be included in the PMOS region and NMOS region, respectively.

In example embodiments, each of the PMOS regions and the NMOS regions may be formed along the first direction in an alternating pattern, and the PMOS regions and the NMOS regions may extend in the second direction. However, the arrangement of the PMOS region and the NMOS region may not be limited thereto.

The channel layer 170, for example, may include silicon-germanium. The channel layer 170 may have a variety of shapes including a tapered shape. However, in one embodiment, the channel layer 170 may not have a tapered shape, i.e. a shape becoming narrower from a bottom portion to an upper portion thereof, but include a sidewall substantially perpendicular to a top surface of the substrate 100 and a flat top surface. In the same or a different embodiment, an upper edge portion of the channel layer 170 may have a substantially rounded shape. Also, in example embodiments, the top surface of the channel layer 170 may be coplanar with top surfaces of the third and fourth active regions 106 and 108 of the NMOS region or a top surface of the isolation layer pattern 112 in the NMOS region.

The first gate structure 280a may include a gate insulation layer pattern, a first work function control layer pattern, a second work function control layer pattern and a doped polysilicon layer pattern sequentially stacked, and the second gate structure may include the second work function control layer pattern and the doped polysilicon layer pattern sequentially stacked.

The gate insulation layer pattern may include a low-k dielectric layer pattern 185 and a high-k dielectric layer pattern 195 sequentially stacked. The first work function control layer pattern may include a first barrier layer pattern 205, a first metal layer pattern 215, and a second barrier layer pattern 225 sequentially stacked. The second work function control layer pattern may include a second metal layer pattern 245, and a third barrier layer pattern 255 sequentially stacked.

For example, the low-k dielectric layer pattern 185 may include silicon oxide, and the high-k dielectric layer pattern may 195 include a metal oxide, e.g. hafnium oxide, zirconium oxide, etc. The first to third barrier layer patterns 205, 225, and 225 may include a metal nitride e.g. titanium nitride, tantalum nitride, etc. The first metal layer pattern 215 may include a metal such as aluminum, and the second metal layer pattern 245 may include a metal such as lanthanum.

The structures of the first and second gate structures may not be limited to the above-described ones, and may have various other structures as PMOS and NMOS gate structures, respectively. For example, the first gate structure may include only the first work function control layer pattern containing aluminum instead of the first work function control layer pattern including aluminum and the second work function control layer pattern including lanthanum. Alternatively, each of the first and second gate structures may have a proper work function by controlling the doping concentration of the doped polysilicon layer pattern 265, instead of having the additional work function control layer patterns. In this case, the gate insulation layer pattern may not include the high-k dielectric layer pattern 195 but may include the low-k dielectric layer pattern 185 only.

First and second source/drain regions may be formed at upper portions of active regions 102, 104, 106 and 108 adjacent to the first and second gate structure. Thus, the first gate structure and the first source/drain region may form a PMOS transistor, and the second gate structure and the second source/drain region may form an NMOS transistor.

The groove 160 may be formed on the isolation layer pattern 112 adjacent to the channel layer 170, i.e., a portion of the isolation layer pattern 112 within the PMOS region. At least a portion of a bottom surface of the groove 160 may be lower than a bottom surface of the channel layer 170.

By using the groove 160 formed on the isolation layer pattern 112, the first gate structure formed within the PMOS region may cover not only the top surface of the channel layer 170 but also the sidewall thereof. Therefore, an area of the first gate structure contacting the channel layer 170 may be relatively increased. Accordingly, the PMOS transistor may have an improved performance, e.g. a decreased leakage current. Additionally, the threshold voltage mismatch between the PMOS transistor and the NMOS transistor may be reduced. Such an improvement of the characteristics of the semiconductor device will be described later by comparing to Comparative Example referring to FIG. 18.

FIGS. 4 to 17 illustrate cross-sectional views of different stages in one embodiment of a method of manufacturing a semiconductor device. This method may be used for manufacturing the semiconductor device in FIGS. 4 to 17; however, may not be limited thereto.

Figure 4:
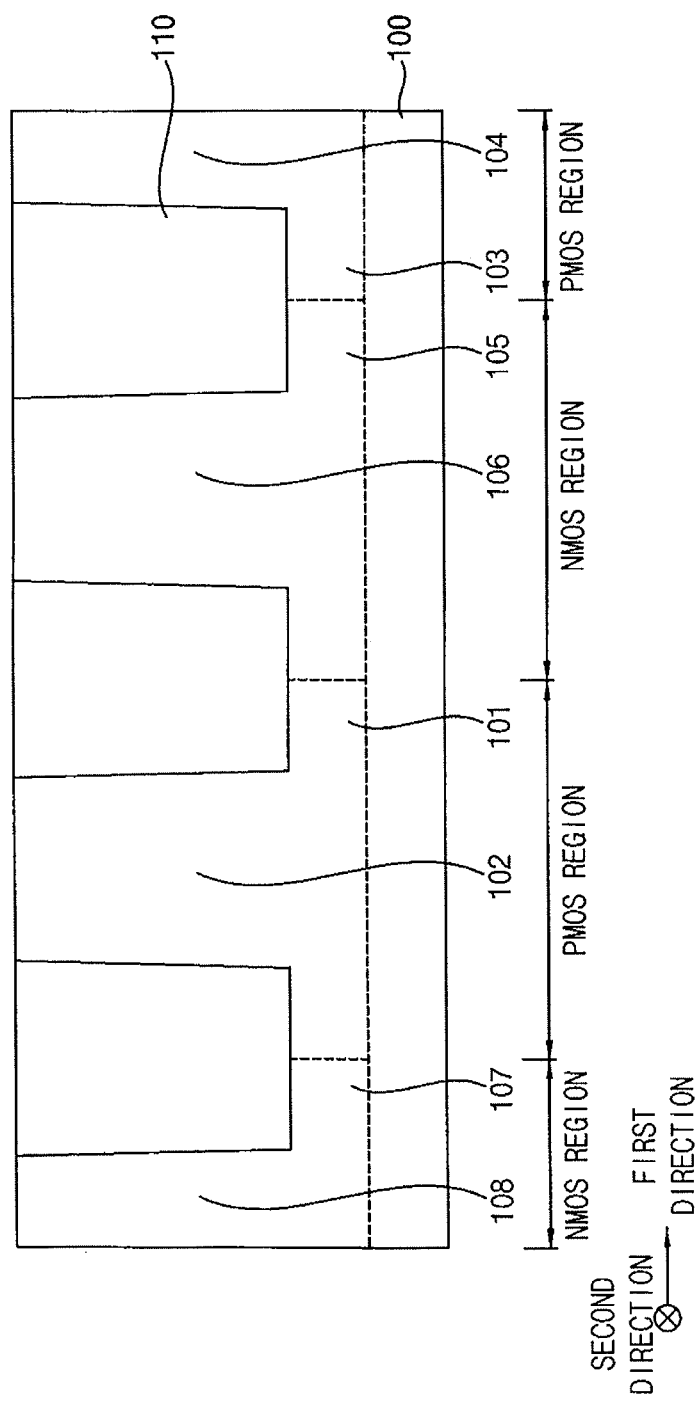
FIGS. 4-17 illustrate an embodiment of a method of manufacturing a semiconductor device.

Referring to FIG. 4, an isolation layer 110 may be formed on a substrate 100, and wells 101, 103, 105 and 107 may be formed by implanting impurities in the substrate 100.

In example embodiments, the isolation layer 110 may be formed by performing a shallow trench isolation (STI) process. In other words, a trench may be formed on an upper portion of the substrate 100 and an insulation layer within (and which, in one embodiment, may fill up the trench) may be formed on the substrate 100. Thereafter, the isolation layer 110 may be formed by planarizing the insulation layer until a top surface of the substrate 100 may be exposed. For example, the insulation layer may be formed using silicon oxide.

The substrate 100 may be divided into an active region and a field region by the isolation layer 110. In example embodiments, a plurality of active regions 108, 102, 106 and 104 may be formed on the substrate 100 along a first direction. Each active region 102, 104, 106 and 108 may extend in a second direction substantially perpendicular to the first direction. Reference numerals 102, 104, 106, and 108 may indicate first to fourth active regions, respectively. As the isolation layer 110 is formed partially on the substrate 100, each upper portion of the active regions 102, 104, 106, and 108 may protrude from the substrate 100 in a vertical direction.

Wells 101, 103, 105 and 107 may be formed by doping p-type impurities or n-type impurities into the substrate 100. Particularly, a first well 101 and a second well 103 may be formed as n-type wells doped with n-type impurities, and a third well 105 and a fourth well 107 may be formed as p-type wells doped with p-type impurities. Accordingly, the substrate 100 may include a PMOS region with n-type wells 101 and 103 and a NMOS region with p-type wells 105 and 107. In example embodiments, each of the first to fourth active regions 102, 104, 106, and 108 may be defined in the first to fourth wells 101, 103, 105, and 107, respectively, and therefore, may be included in the PMOS region and NMOS region, respectively.

In example embodiments, the PMOS region and the NMOS region may be formed alternatively along the first direction, and each of the PMOS region and the NMOS region may extend in the second direction.

An impurity doping process may be further performed on active regions 102, 104, 106, and 108 to form channels at upper portions thereof.

Figure 5:
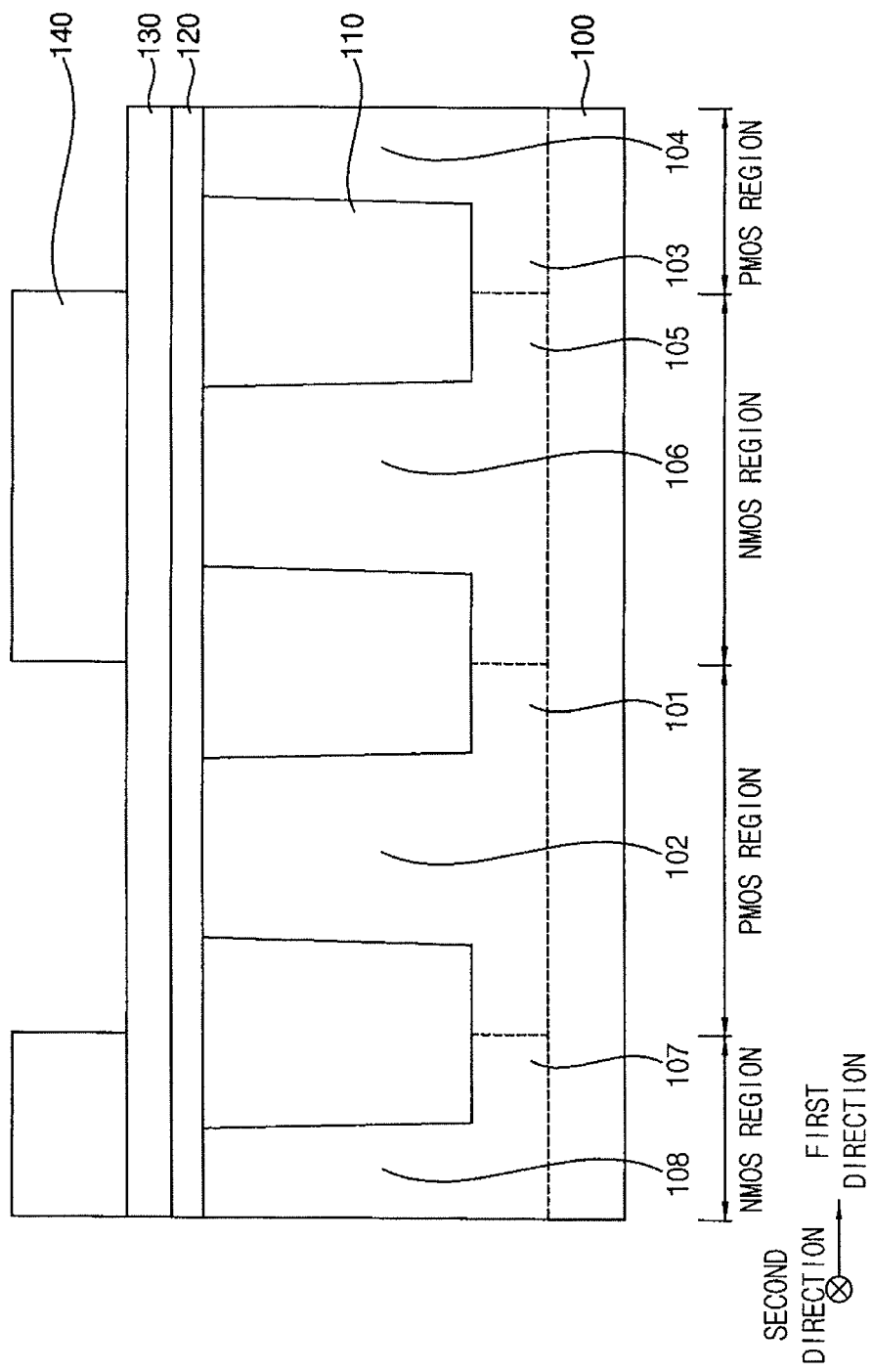

Referring to FIG. 5, a mask layer 120 and a buffer layer 130 may be formed sequentially on the substrate 100 and the isolation layer 110, and a first photoresist pattern 140 may be formed on the buffer layer 130. For example, the mask layer 120 may be formed using silicon oxide, and the buffer layer 130 may be formed using silicon nitride. The buffer layer 130 may be formed to increase the adhesive property between the mask layer 120 and the first photoresist pattern 140.

In example embodiments, the first photoresist pattern 140 may extend in the second direction and be formed to cover the NMOS region and to leave exposed the PMOS region. In other words, the first photoresist pattern 140 may be formed to cover the third and fourth active regions 106 and 108 and a portion of the isolation layer 110 in the NMOS region, and to expose the first and second active regions 102 and 104 and a portion of the isolation layer 110 in the PMOS region.

Figure 6:
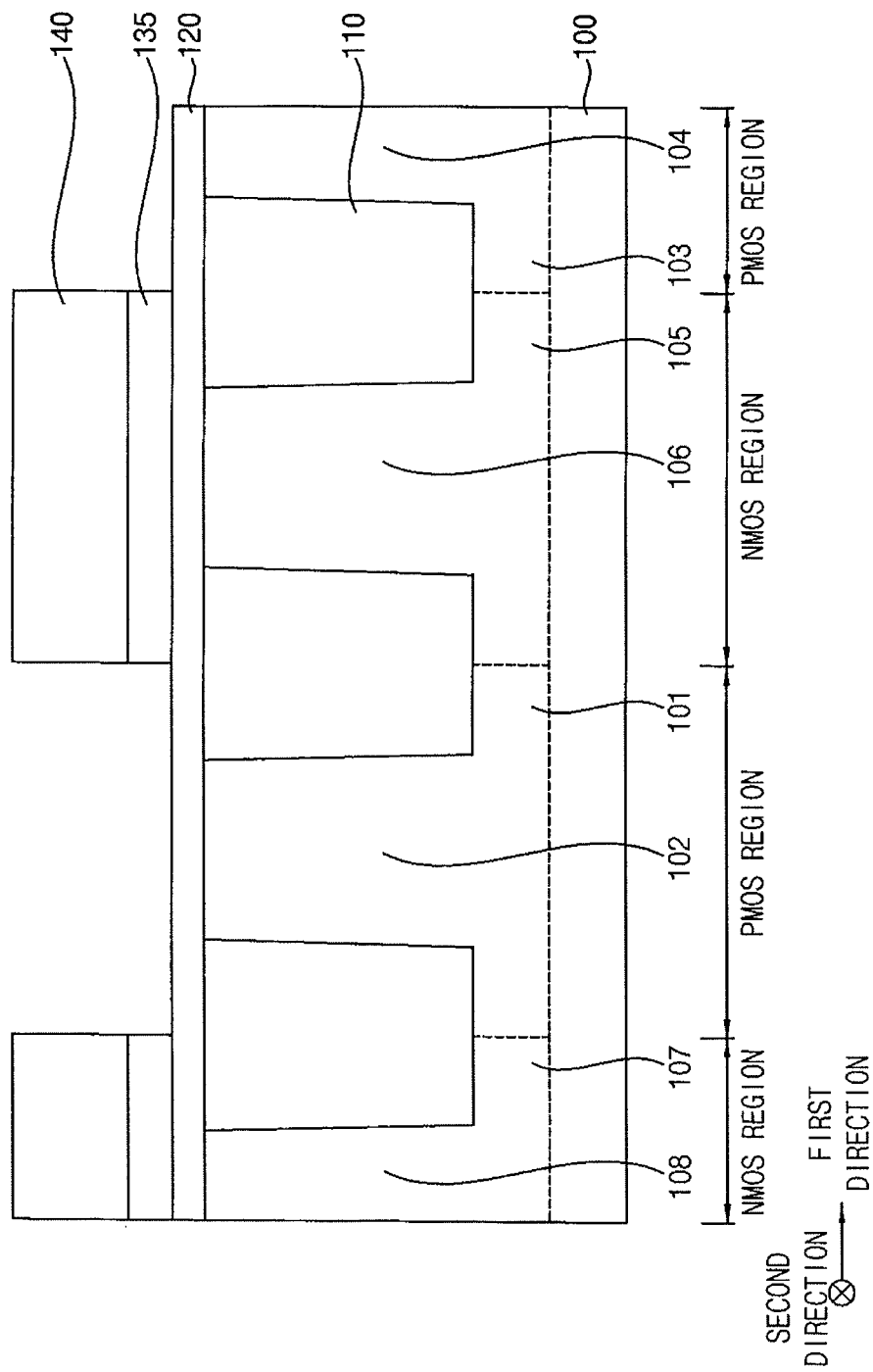

Referring to FIG. 6, the buffer layer 130 may be etched using the first photoresist pattern 140 to form a buffer layer pattern 135. In example embodiments, the buffer layer 130 may be etched by a dry etching process. The buffer layer pattern 135 may be formed to overlap the NMOS region and extend in the second direction.

Figure 7:
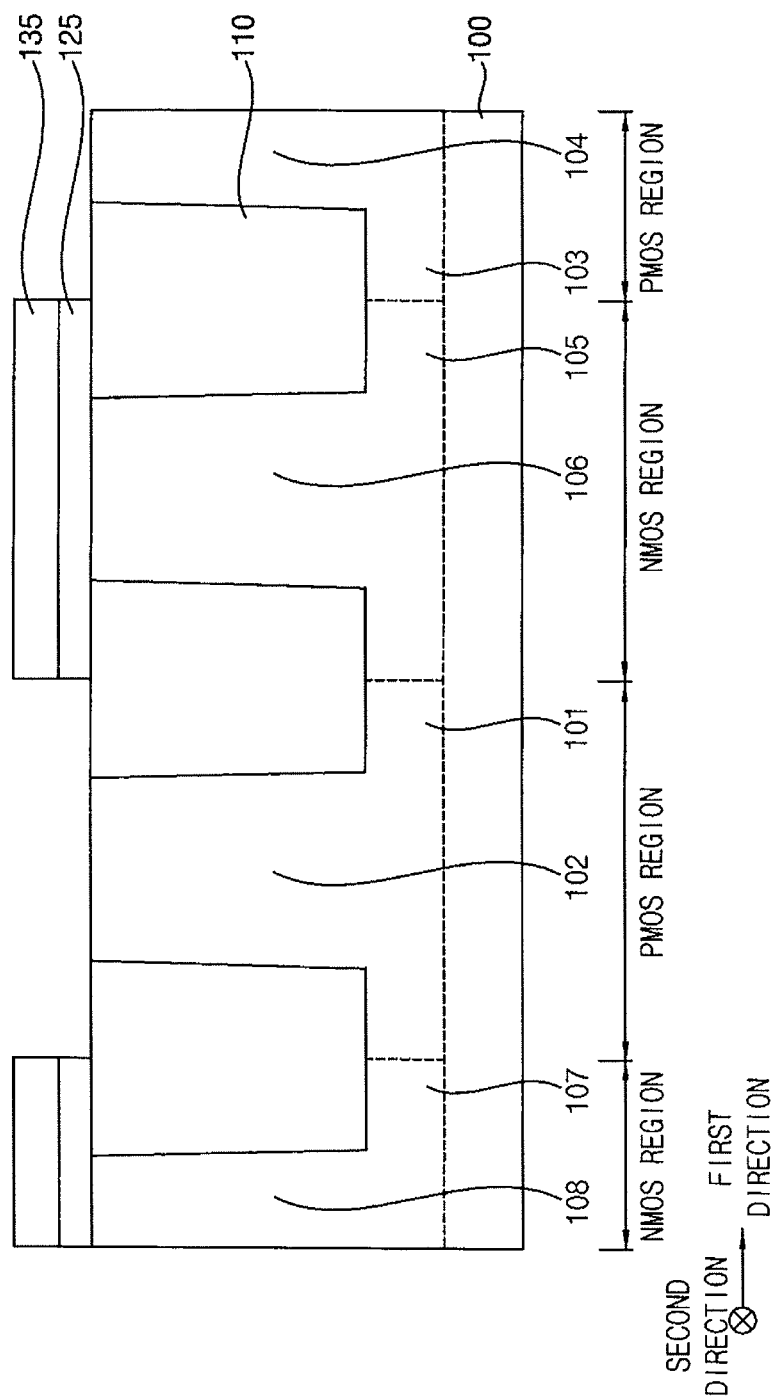

Referring to FIG. 7, after the first photoresist pattern 140 is removed, the mask layer 120 may be etched using the buffer layer pattern 135 to form an etch mask 125. In example embodiments, the first photoresist pattern 140 may be removed by an ashing process and/or a stripping process. In example embodiments, the mask layer 120 may be etched by a wet etch process. The etch mask 125 may be formed to overlap the NMOS region and extend in the second direction.

Figure 8:
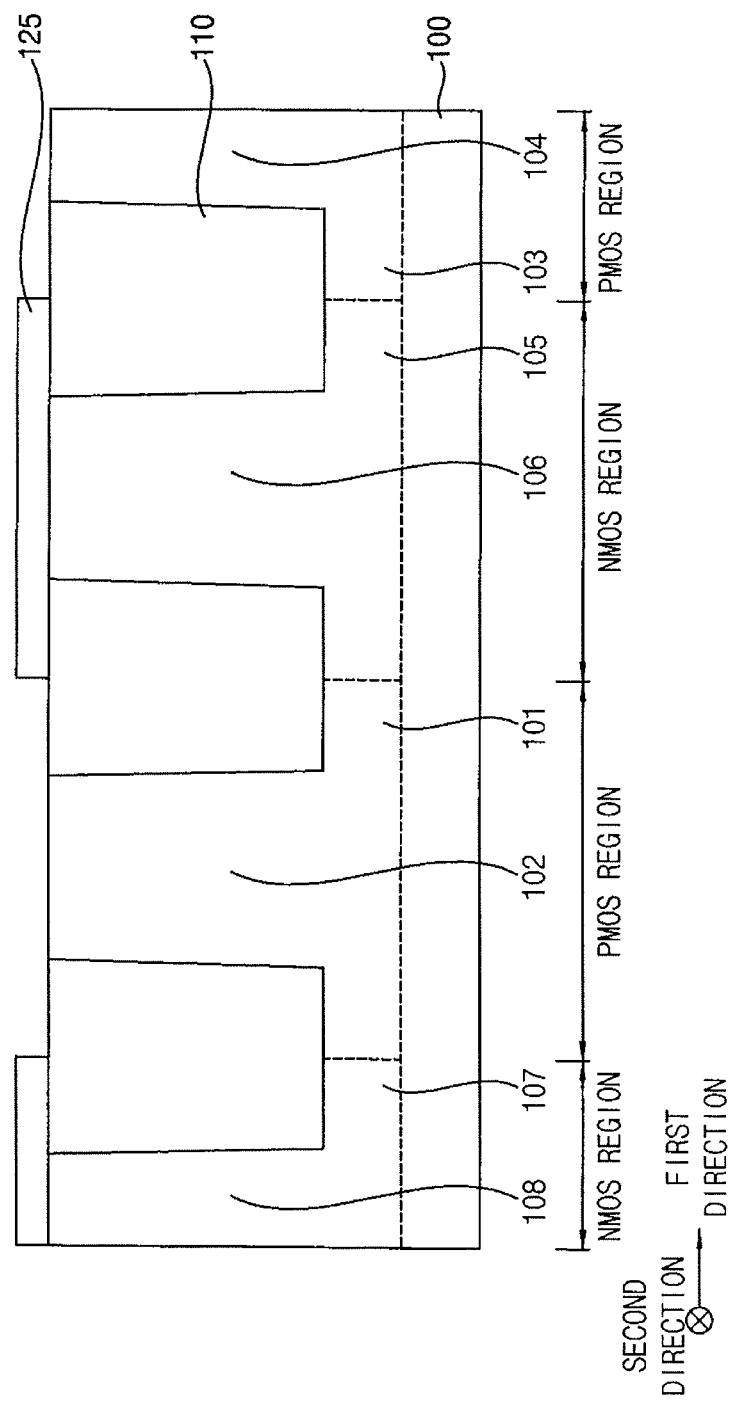

Referring to FIG. 8, the buffer layer pattern 135 may be removed, and thus the etch mask 125 may be exposed. In example embodiments, the buffer layer pattern 135 may be removed by a stripping process using phosphoric acid (H3PO4).

Figure 9:
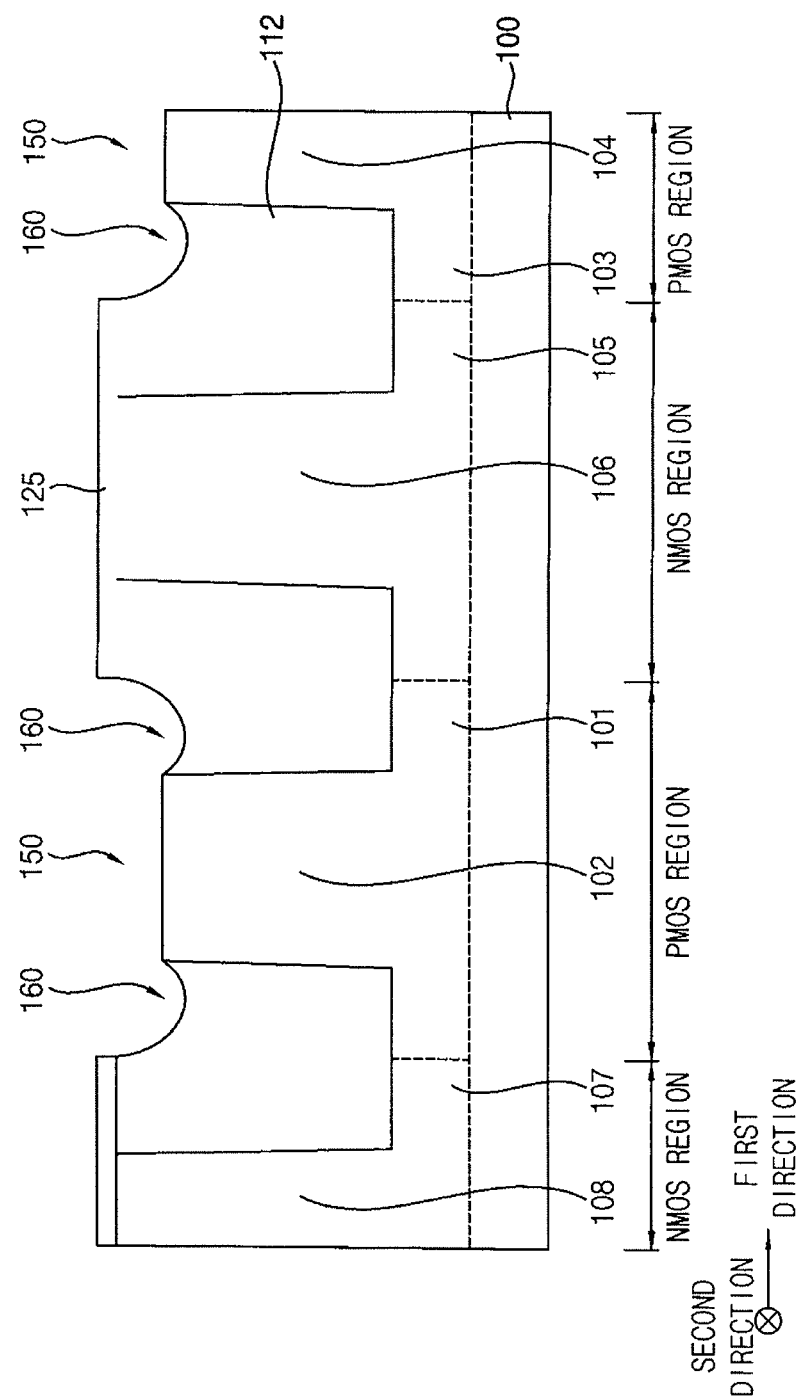

Referring to FIG. 9, an upper portion of the exposed first and second active regions 102 and 104 may be etched using the etch mask 125 to form a recess 150. In example embodiments, the recess 150 may be formed by a wet etching process using hydrofluoric acid (HF) as an etching solution. A portion of the isolation layer 110 not covered by the etch mask 125 in the PMOS region may be also etched to form a groove 160. Therefore, the isolation layer 110 may be transformed into an isolation layer pattern 112.

Hereinafter, for convenience, not only the portion of the isolation layer 110 where the groove 160 is formed in the PMOS region, but also a portion of the isolation layer 110 where the groove 160 is not formed, may be referred to as the isolation layer pattern 112. In example embodiments, the recess 150 may have a flat bottom surface. Also, the groove 160 may be in fluid communication with the recess 150. At least a portion of the bottom surface of the groove may be formed to be lower than that of the recess 150.

The etch mask 125 containing silicon nitride may become thinner in the wet etching process. However, the third and fourth active regions 106 and 108 and a portion of the isolation layer pattern 112 in the NMOS region may still be covered by the etch mask 125.

Figure 10:
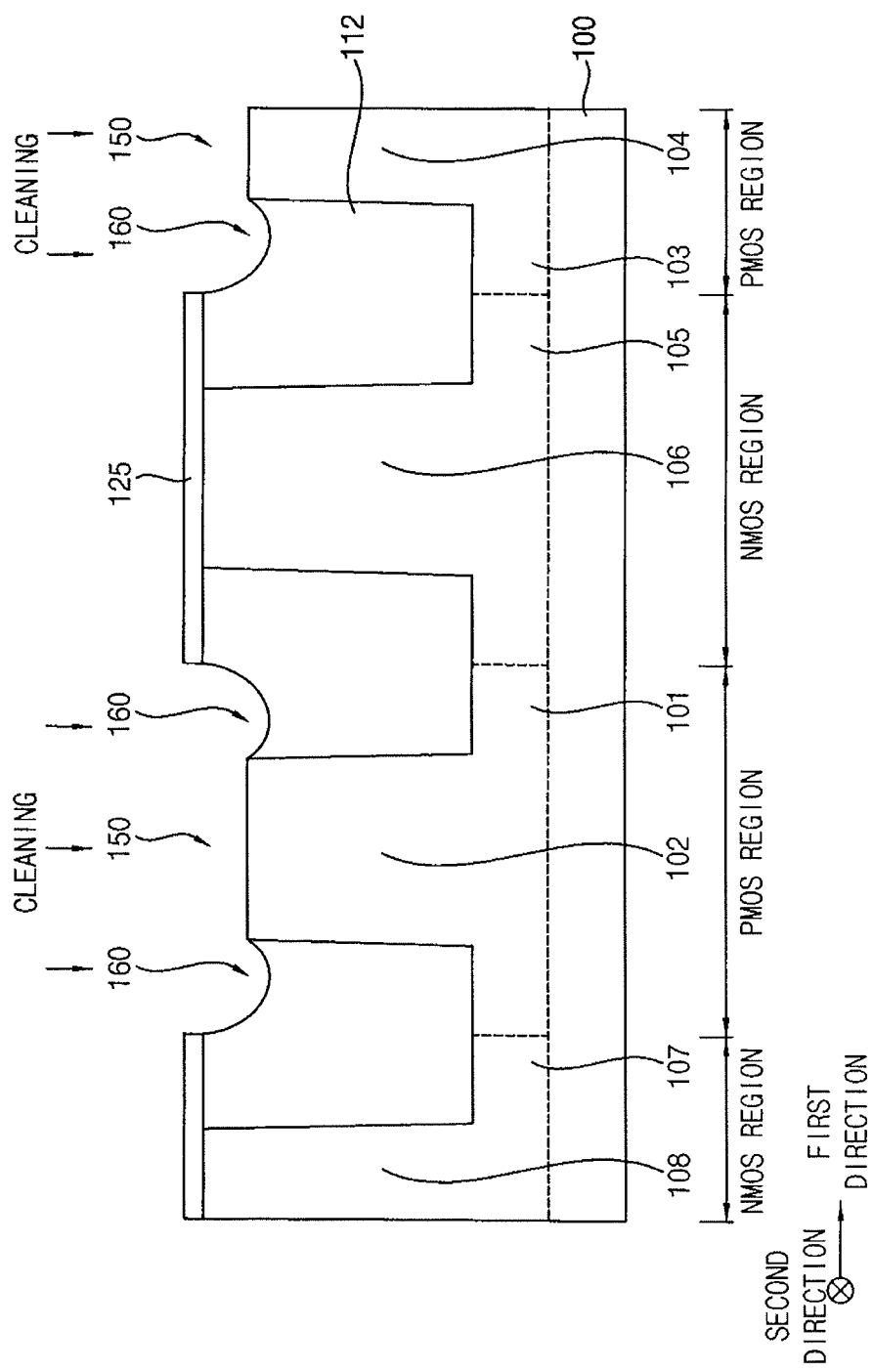

Referring to FIG. 10, a cleaning process may be performed so that a natural oxide layer (not shown) which may be formed on top surfaces of the first and second active regions 102 and 104 in the PMOS region exposed by the recess 150 may be removed.

Figure 11:
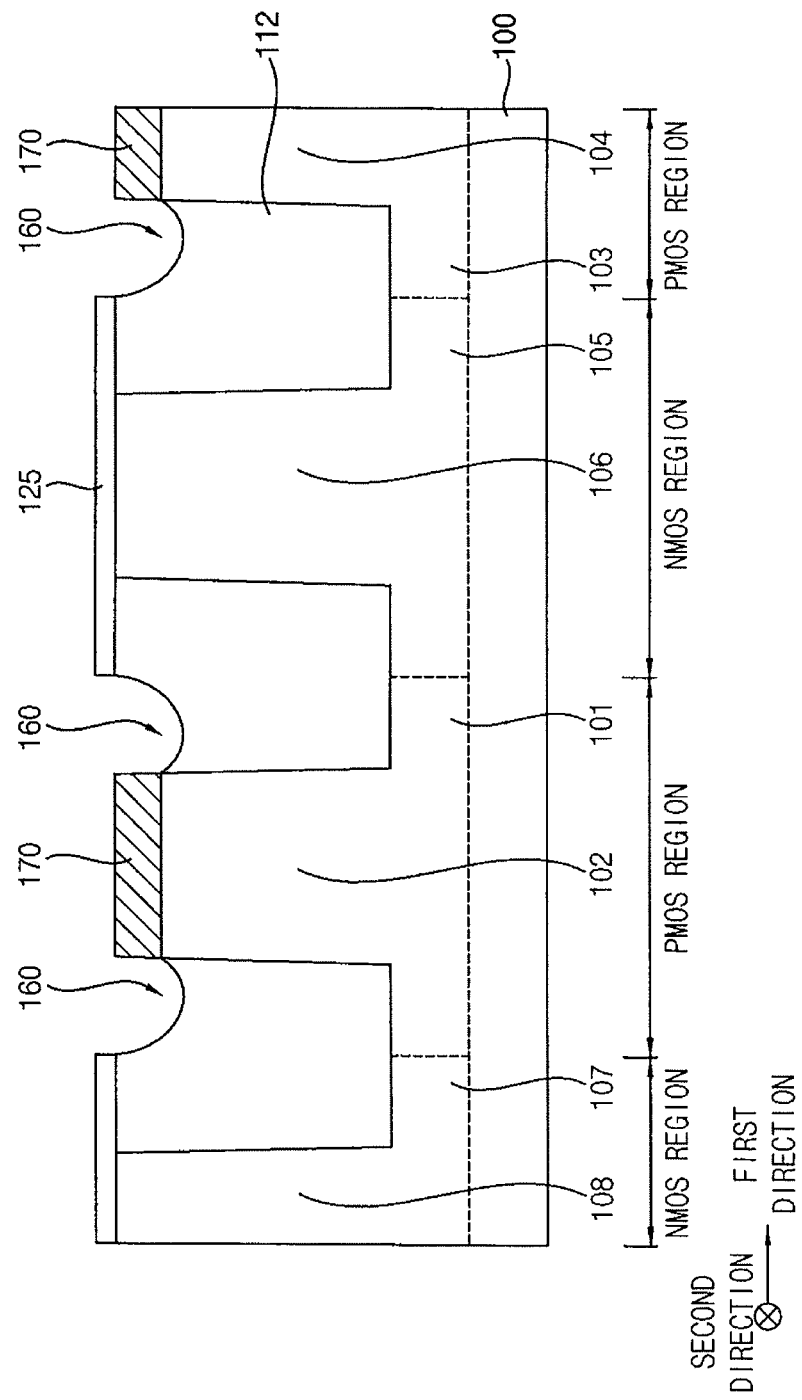

Referring to FIG. 11, a channel layer 170 filling the recess 150 may be formed on the exposed first and second active regions 102 and 104 in the PMOS region. The channel layer 170, for example, may be formed to include silicon-germanium. In example embodiments, the channel layer 170 may be formed by a selective epitaxial growth (SEG) process using the exposed first and second active regions 102 and 104 in the PMOS region as a seed. The channel layer may not be formed on the substrate 100 in the NMOS region in the SEG process because of the etch mask 125 in the NMOS region.

In an example embodiment, the SEG process may be performed by a chemical vapor deposition (CVD) process at a temperature of about 500 to about 900 degrees Celsius and under a pressure of about 0.1 torr to normal pressure. The CVD process, for example, may be performed using dichlorosilane (SiH2Cl2) gas, germane (GeH4) gas and etc., as a source gas, and thus a single crystalline silicon-germanium (SiGe) layer may be formed. In this case, an impurity source gas may be also used to form a single crystalline silicon-germanium layer doped with impurities.

When the SEG process for forming the channel layer 170 is performed, the channel layer 170 may grow sufficiently on an edge portion as well as a center potion of the recess 150 with no effect of the isolation layer pattern 112 because the groove 160 having the bottom surface lower than that of the recess 150 is formed adjacent to the recess 150. Additionally, as mentioned above, the recess 150 may be formed to have the flat bottom surface so that the exposed upper portions of the first and second active regions 102 and 104 may serve as seeds layers with flat top surfaces. Therefore, the channel layer 170 may have a variety of shapes including a tapered shape.

In one embodiment, the channel layer 170 may have a shape different from a tapered shape (i.e., a shape becoming narrower from a bottom portion to an upper portion thereof), but may include a sidewall substantially perpendicular to a top surface of the substrate 100 and a flat top surface. Also, in one embodiment, an upper edge portion of the channel layer 170 may have a substantially rounded shape. Also, in example embodiments, the channel layer 170 may be formed to have the top surface substantially coplanar with top surfaces of the third and fourth active regions 106 and 108 on which no recess is formed or a top surface of the isolation layer pattern 112 in the NMOS region.

Figure 12:
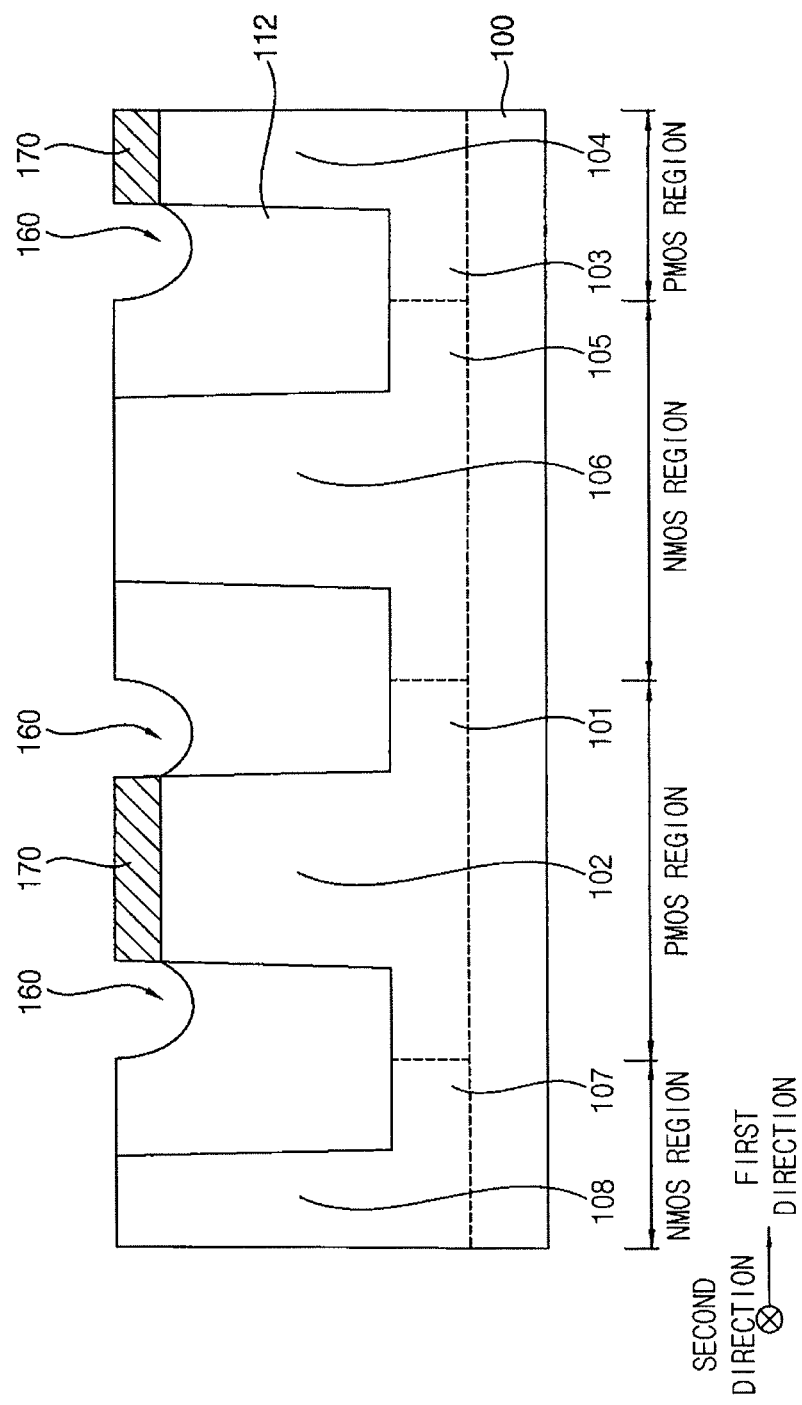

Referring to FIG. 12, the etch mask 125 may be removed to expose the third and fourth active regions 106 and 108 and the portion of the isolation layer pattern 112 in the NMOS region. In example embodiments, the etch mask 125 may be removed by a wet etching process. In the above wet etching process, a portion of the isolation layer pattern 112 may be also etched and a depth of the groove 160 may become deeper.

Figure 13:
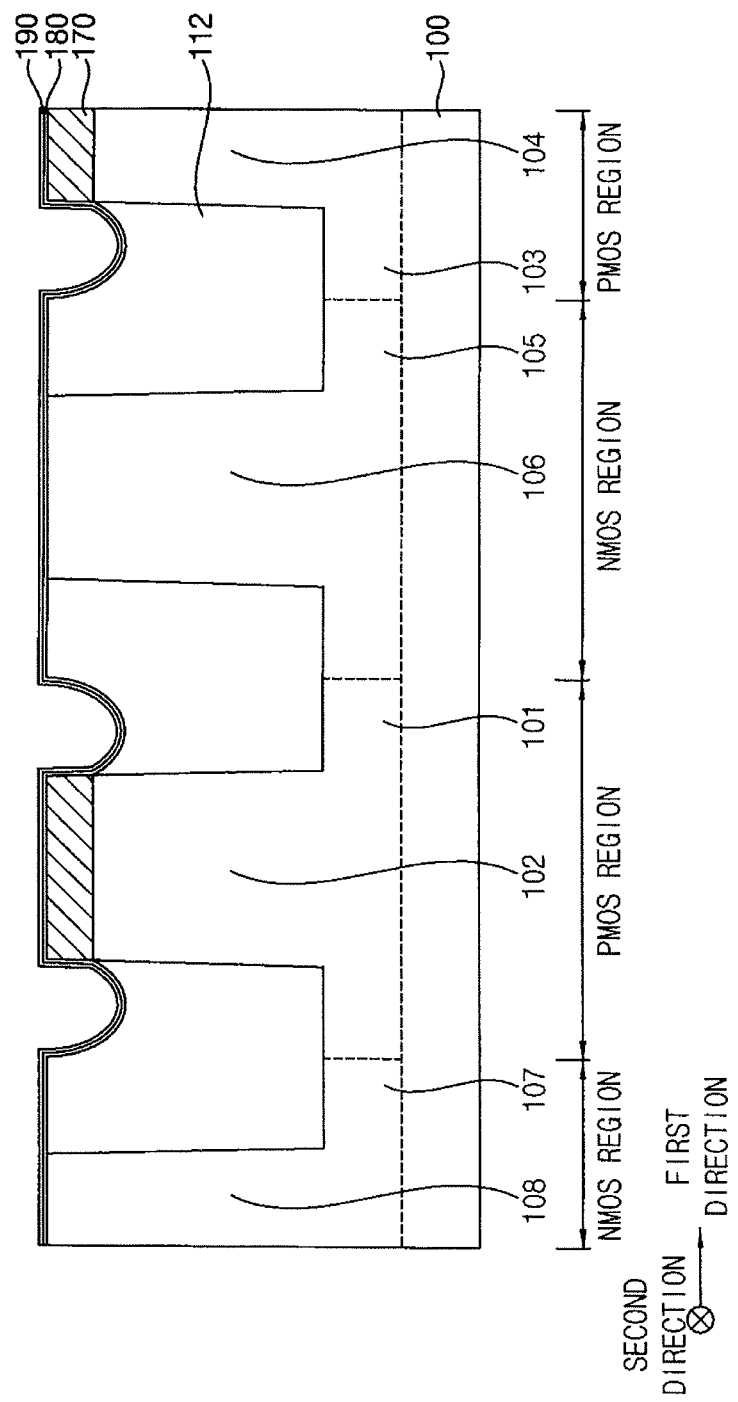

Referring to FIG. 13, a gate insulation layer may be formed on the channel layer 170, the third and fourth active regions 106 and 108, and the isolation layer pattern 112. In example embodiments, the gate insulation layer pattern may be formed by sequentially stacking a low-k dielectric layer 180 and a high-k dielectric layer 190. For example, the low-k dielectric layer 180 may be formed to include silicon oxide, and the high-k dielectric layer 190 may formed to include a metal oxide, e.g. hafnium oxide, zirconium oxide, etc.

Figure 14:
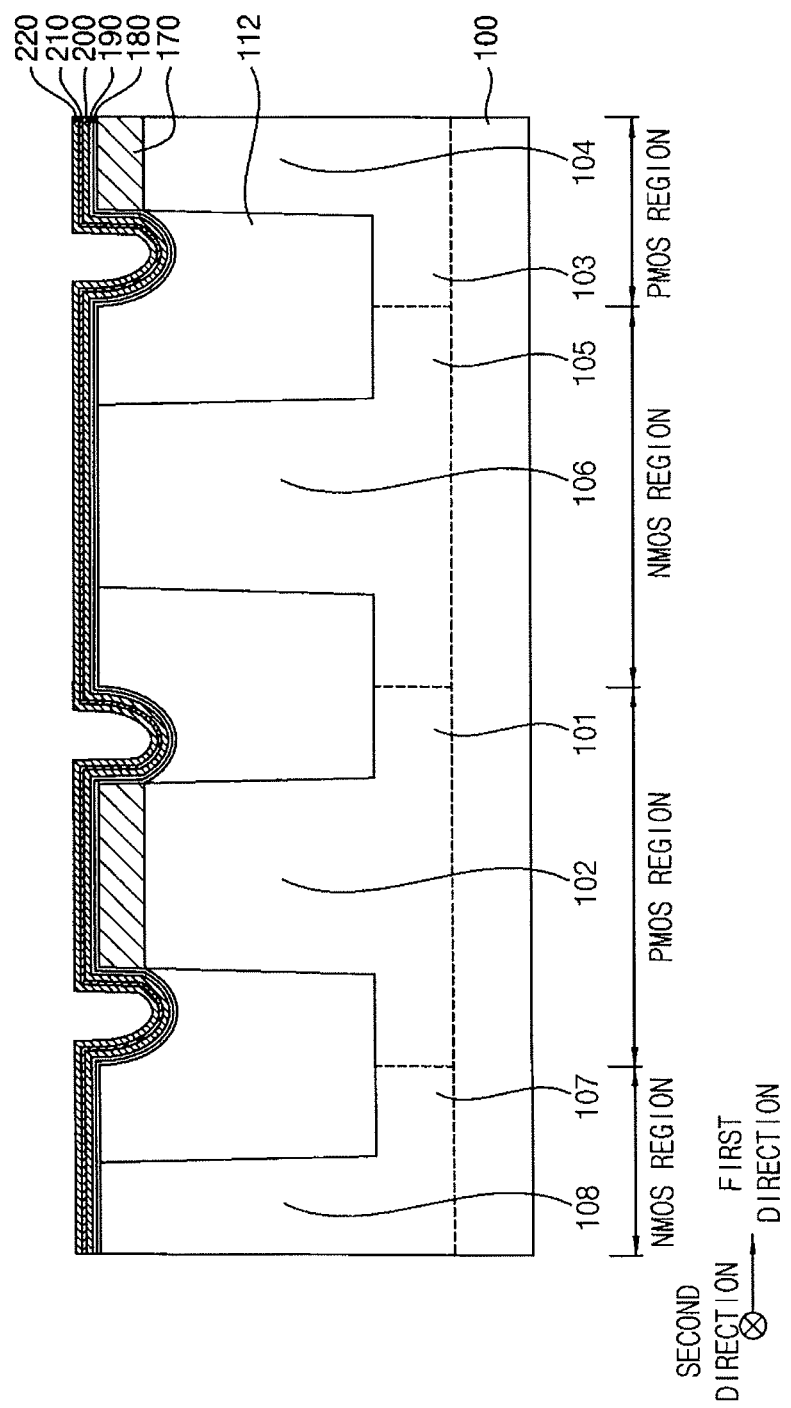

Referring to FIG. 14, a first work function control layer may be formed on the gate insulation layer. In example embodiments, the first work function control layer may be formed by sequentially stacking a first barrier layer 200, a first metal layer 210, and a second barrier layer 220. For example, the first and second barrier layers 200 and 220 may be formed to include a metal nitride e.g. titanium nitride, tantalum nitride, etc. The second metal layer 210 may be formed to include a metal, e.g. aluminum.

Figure 15:
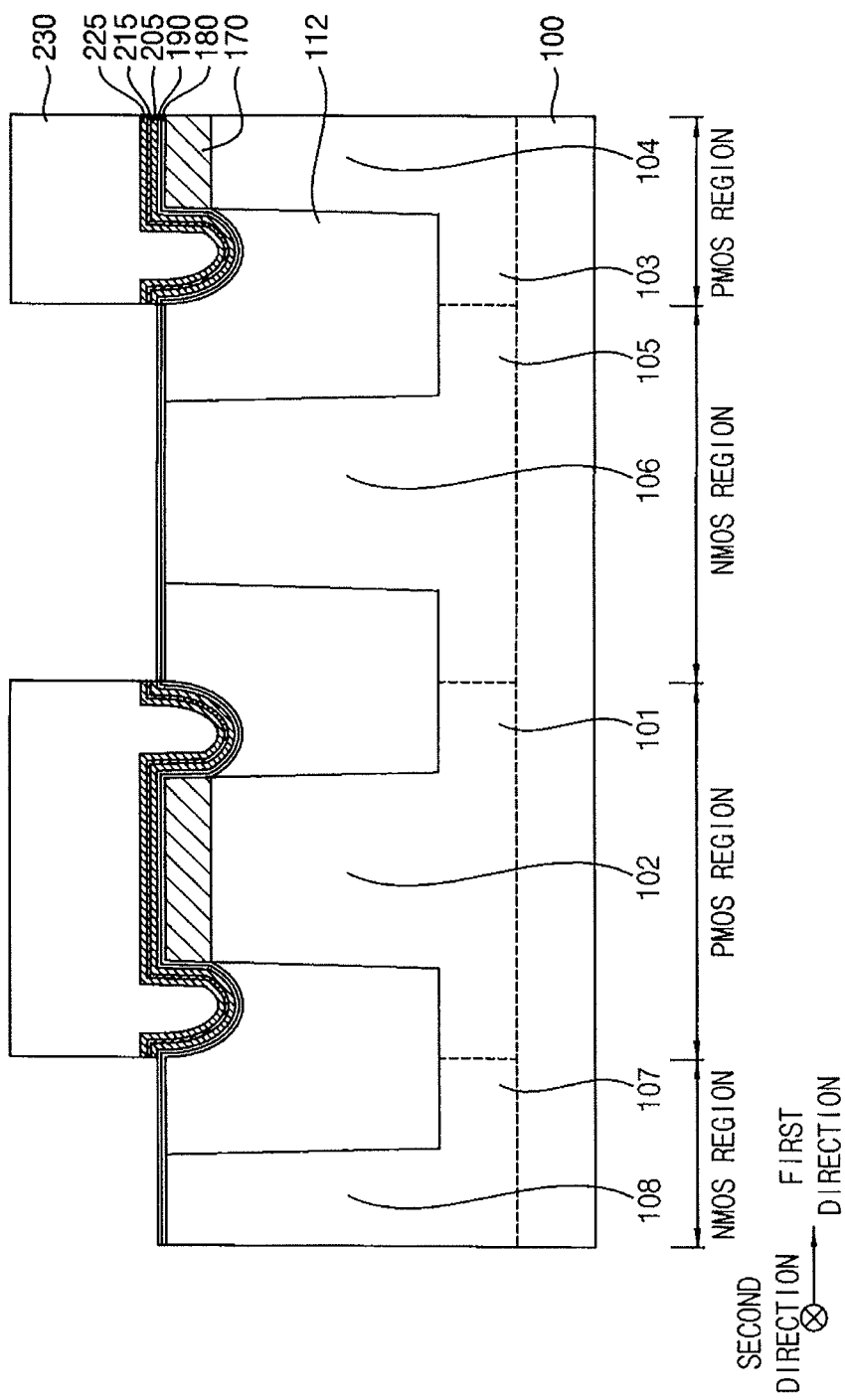

Referring to FIG. 15, the first work function control layer may be patterned using a second photoresist pattern 230 as an etching mask to form a first work function control layer pattern. In example embodiments, the second photoresist pattern 230 may be formed to cover the PMOS region and to leave exposed the NMOS region. Therefore, the first work function control layer pattern overlapping the PMOS region may be formed. In example embodiments, the first work function control layer pattern may include a first barrier layer pattern 205, a first metal layer pattern 215, and a second barrier layer pattern 225 sequentially stacked.

Figure 16:
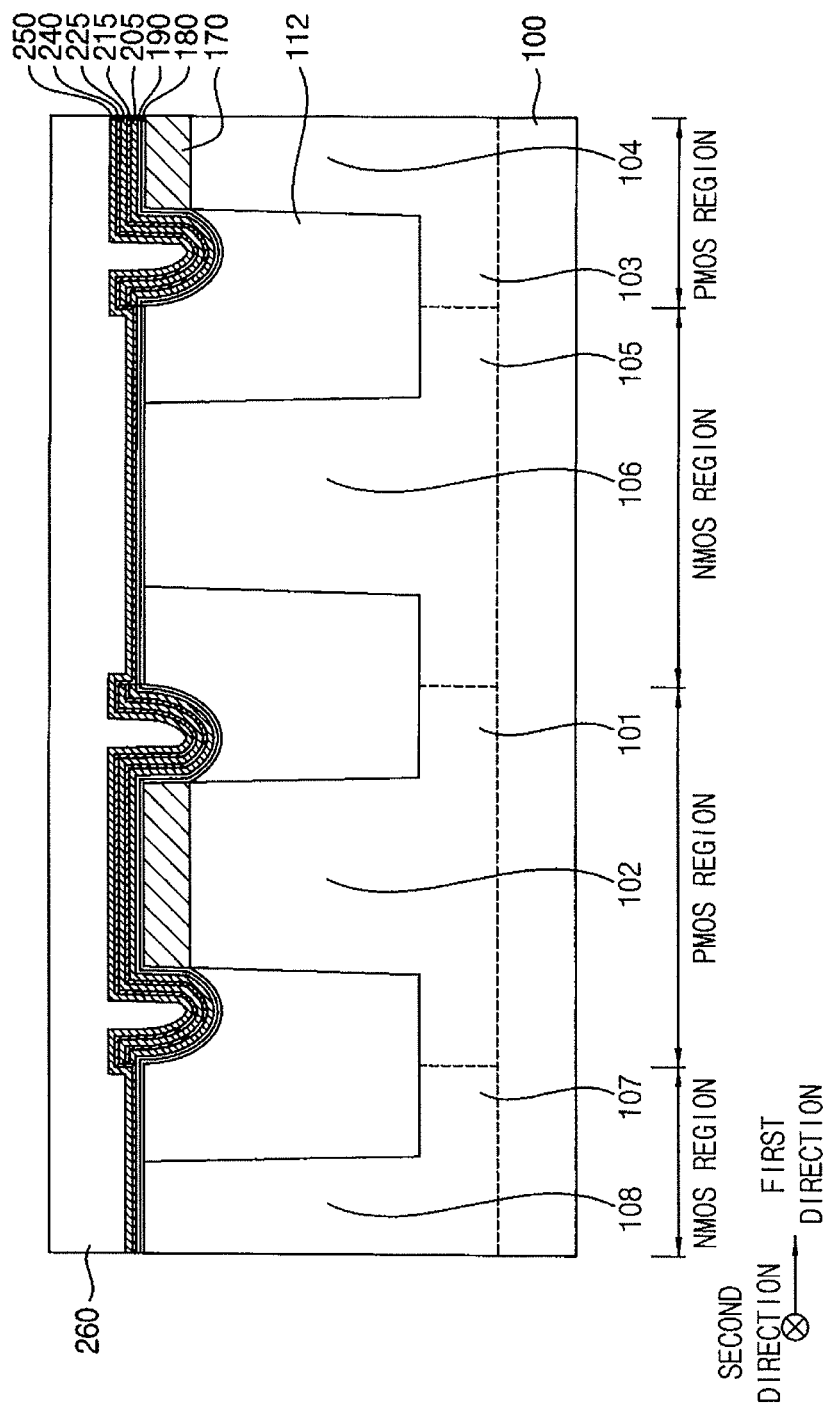

Referring to FIG. 16, a second work function control layer and a doped polysilicon layer 260 may be sequentially formed on the first work function control layer pattern and the gate insulation layer. In example embodiments, the second work function layer may be formed by sequentially stacking a second metal layer 240 and a third barrier layer 250. For example, the second metal layer 240 may be formed to include a metal, e.g. lanthanum, and the third barrier layer 250 may be formed to include a metal nitride, e.g. titanium nitride, tantalum nitride, etc.

Figure 17:
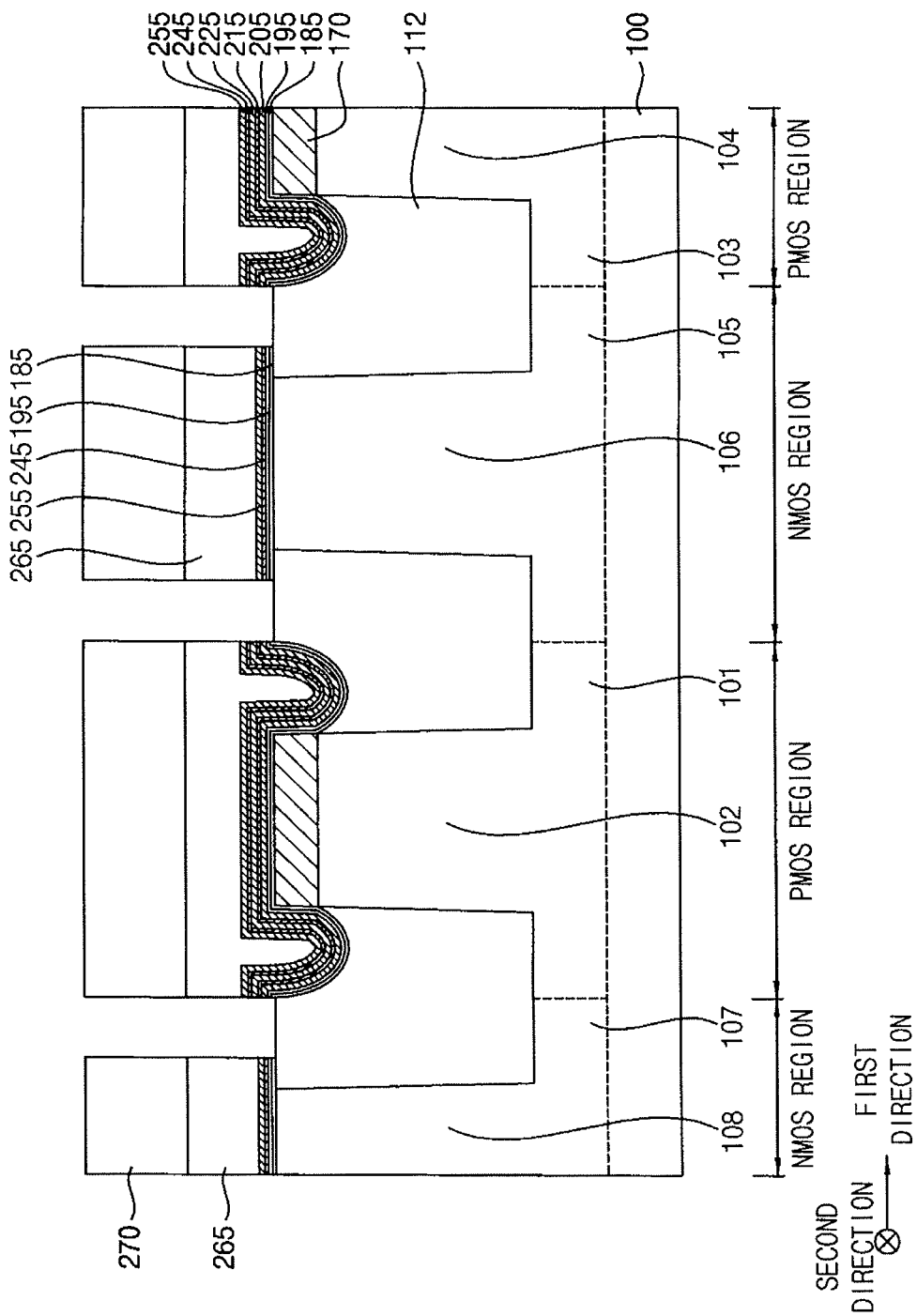

Referring to FIG. 17, the doped polysilicon layer 260, the second work function control layer, the first work function control layer pattern, and the gate insulation layer may be patterned by an etching process using a third photoresist pattern 270 as an etching mask to form a gate insulation layer pattern, a first work function control layer pattern, a second work function control layer pattern, and a doped polysilicon layer pattern 265 sequentially stacked on the channel layer 170 and the isolation layer pattern 112 in the PMOS region. The gate insulation layer pattern, the second work function control layer pattern, and the doped polysilicon layer pattern 265 may be sequentially stacked on the third and fourth active regions 106 and 108 and the isolation layer pattern 112 in the NMOS region.

In example embodiments, the gate insulation pattern may include a low-k dielectric layer 185 and a high-k dielectric layer 195 sequentially stacked. The first work function control layer pattern may include a first barrier layer pattern 205, a first metal layer pattern 215, and a second barrier layer pattern 225 sequentially stacked. The second work function control layer pattern may include a second metal layer pattern 245 and a third barrier layer pattern 255 sequentially stacked.

Referring to FIG. 1 again, the third photoresist pattern 270 may be removed to complete the semiconductor device. In other words, a first gate structure may be formed on the channel layer 170 and the isolation layer pattern 112 in the PMOS region. A second gate structure may be formed on each of the active regions 106 and 108 in the NMOS region. The first gate structure may include the gate insulation layer pattern, the first work function control layer pattern, the second work function control layer pattern, and the doped polysilicon layer pattern sequentially stacked. The second gate structure may include the gate insulation layer pattern, the second work function control layer pattern, and the doped polysilicon layer pattern sequentially stacked. Gate spacers may be further formed on sidewalls of the gate structures.

The first gate structure may form a PMOS transistor together with first source/drain regions at upper potions of each of the first and second active regions 102 and 104. The second gate structure may form an NMOS transistor together with second source/drain regions at upper portions of each of the first and second active regions 106 and 108. Thus, the semiconductor device may be manufactured to include both of the PMOS transistor and the NMOS transistor.

Figure 18:
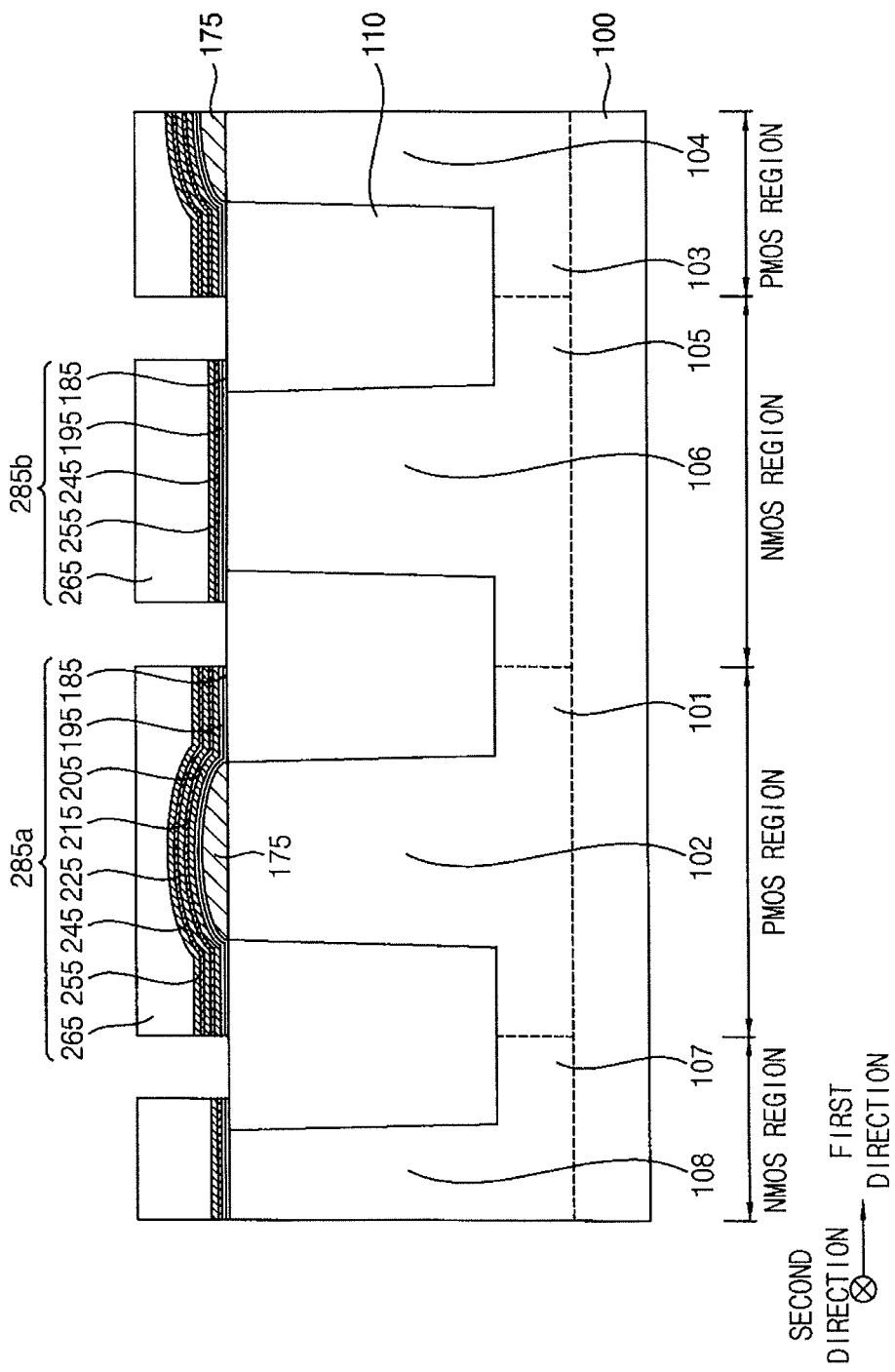
FIG. 18 illustrates a Comparative Example of a semiconductor device.

FIG. 18 illustrates a cross-sectional view illustrating a semiconductor device in accordance with a Comparative Example. This Comparative Example is provided in order to highlight characteristics of one or more embodiments, but it will be understood that the Comparative Example is not to be construed as limiting the scope of the embodiments, nor is the Comparative Example to be construed as being outside the scope of the embodiments. Further, it will be understood that the embodiments are not limited to the particular details described in the Comparative Example.

In FIG. 18, the semiconductor device may be substantially the same as the semiconductor device in accordance with example embodiments illustrated with reference to FIGS. 1 to 3, except for the location and the shape of the channel layer, the shape of the isolation layer adjacent to the channel layer, and the shape of the first gate structure. Thus, like reference numerals refer to like elements, and detailed descriptions thereon are omitted herein.

Referring to FIG. 18, the semiconductor device of the Comparative Example may include a channel layer 175 on the active regions 102 and 104 in the PMOS region, a first gate structure 285a that covers a top surface of the channel layer 175 and formed on the isolation layer 110 adjacent to the channel layer 175, and a second gate structure 285b on the active regions 106 and 108 in the NMOS region.

Top surfaces of the first to fourth active regions 102, 104, 106, and 108 may be substantially coplanar with one another. Grooves may not be formed on the isolation layer 110 in the PMOS region. Thus, each of the active regions 102, 104, 106, and 108 may be defined by the isolation layer 110 with a flat top surface. Sidewalls of the channel layer 175 in the PMOS region may be covered by the first and second active regions 102 and 104.

The channel layer 175 may be formed on the first and second active regions 102 and 104, and have a vertical cross-section having, for example, an elliptical shape or a convex lens shape. In other words, unlike the channel layer 170 illustrated in FIGS. 1 to 3, the channel layer 175 may have neither a vertical sidewall nor a top flat surface, but may have a curved surface where a sidewall and a top surface thereof are not clearly distinguished from each other. The top surfaces of the first to fourth active regions 102, 104, 106 and 108 may be substantially coplanar with one another. Thus, a bottom surface of the channel layer 175 may be substantially coplanar with the top surfaces of the third and fourth active regions 106 and 108 in the NMOS region.

The first gate structure 285a in the PMOS region may cover the curved surface of the channel layer 175 having the elliptical vertical cross-section and be formed on the isolation layer 110 adjacent thereto. Thus, an area of the first gate structure 285a contacting the channel layer 175 may be smaller than an area of the first gate structure 280a illustrated in FIGS. 1 to 3. In other words, an area of the first gate structure 280a contacting the channel layer 170 may be greater than an area of the first gate structure 285a contacting the channel layer 175. As a result, a semiconductor device formed in accordance with example embodiments may have improved characteristics in the aspects of the threshold voltage mismatch and the leakage current.

The semiconductor device of FIG. 18 may be manufactured by a method that does not include the processes of forming the recess 150 and the groove 160 illustrated with reference to FIG. 9. Therefore, the channel layer 175 may not grow at all or to as great an extent on the edge portion of the first and second active regions 102 and 104, as is the case with channel layer 170. When the buffer layer 130 is formed thickly, the buffer layer 130 may not be removed completely from the PMOS region in the process of patterning the buffer layer 130. Thus, a portion of the buffer layer 130 may remain on the sidewall of the etch mask 125 and the top surface of the isolation layer 110, which may interrupt sufficient growth of the channel layer 175. As a result, the channel layer 175 may be formed to include a vertical cross-section of the elliptical shape or the convex lens shape where the distinction between a sidewall and a top surface is ambiguous.

However, in the semiconductor device in accordance with example embodiments, the recess 150 and the groove 160 may be formed on the first and second active regions 102 and 104 and a portion of the isolation layer 110 adjacent thereto, so that the channel layer 170 may grow sufficiently even on the edge portion thereof. Therefore, the channel layer 175 may have a substantially vertical sidewall and a flat top surface.

Figure 19:
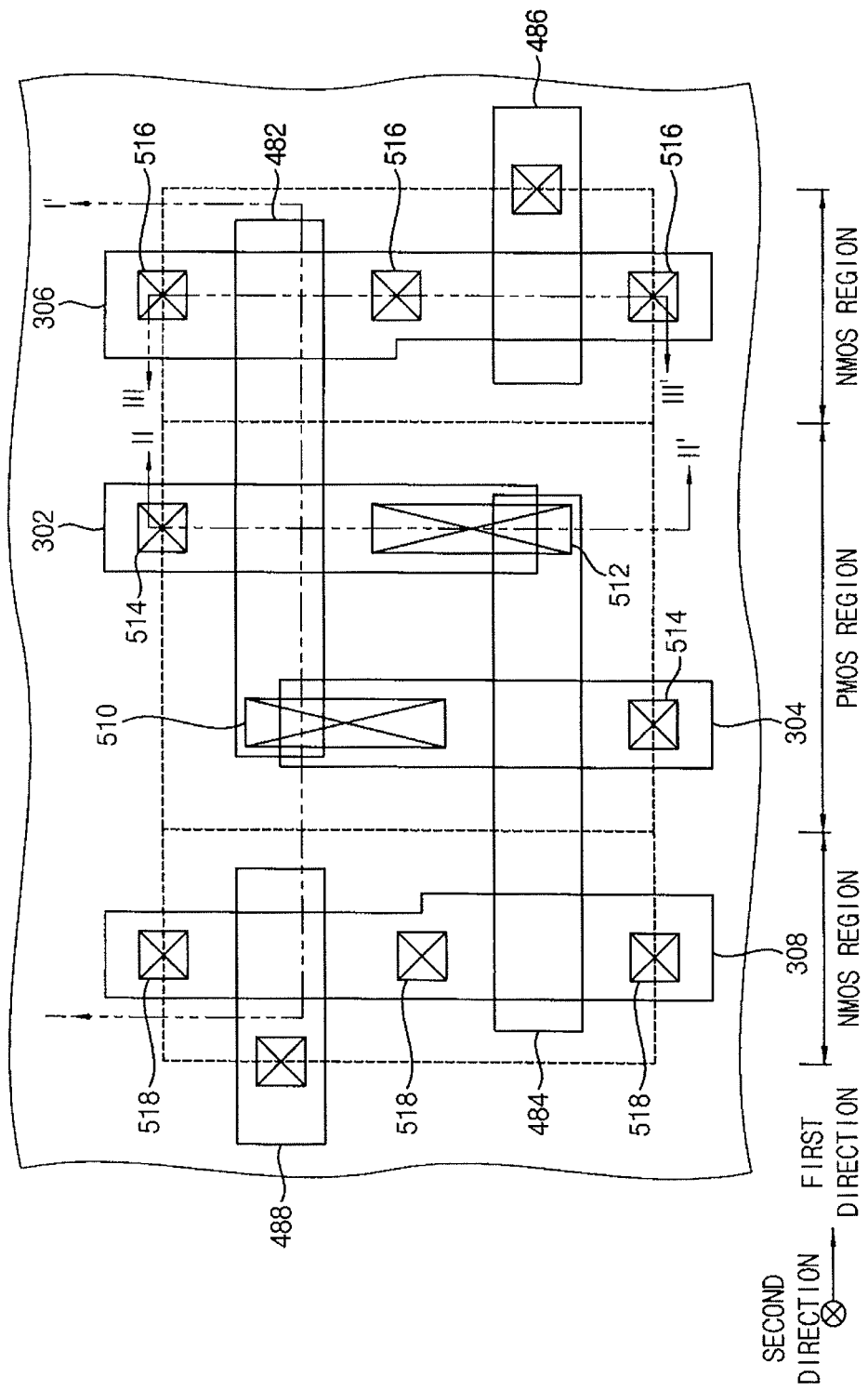
FIG. 19 illustrates another embodiment of a semiconductor device.
Figure 20:
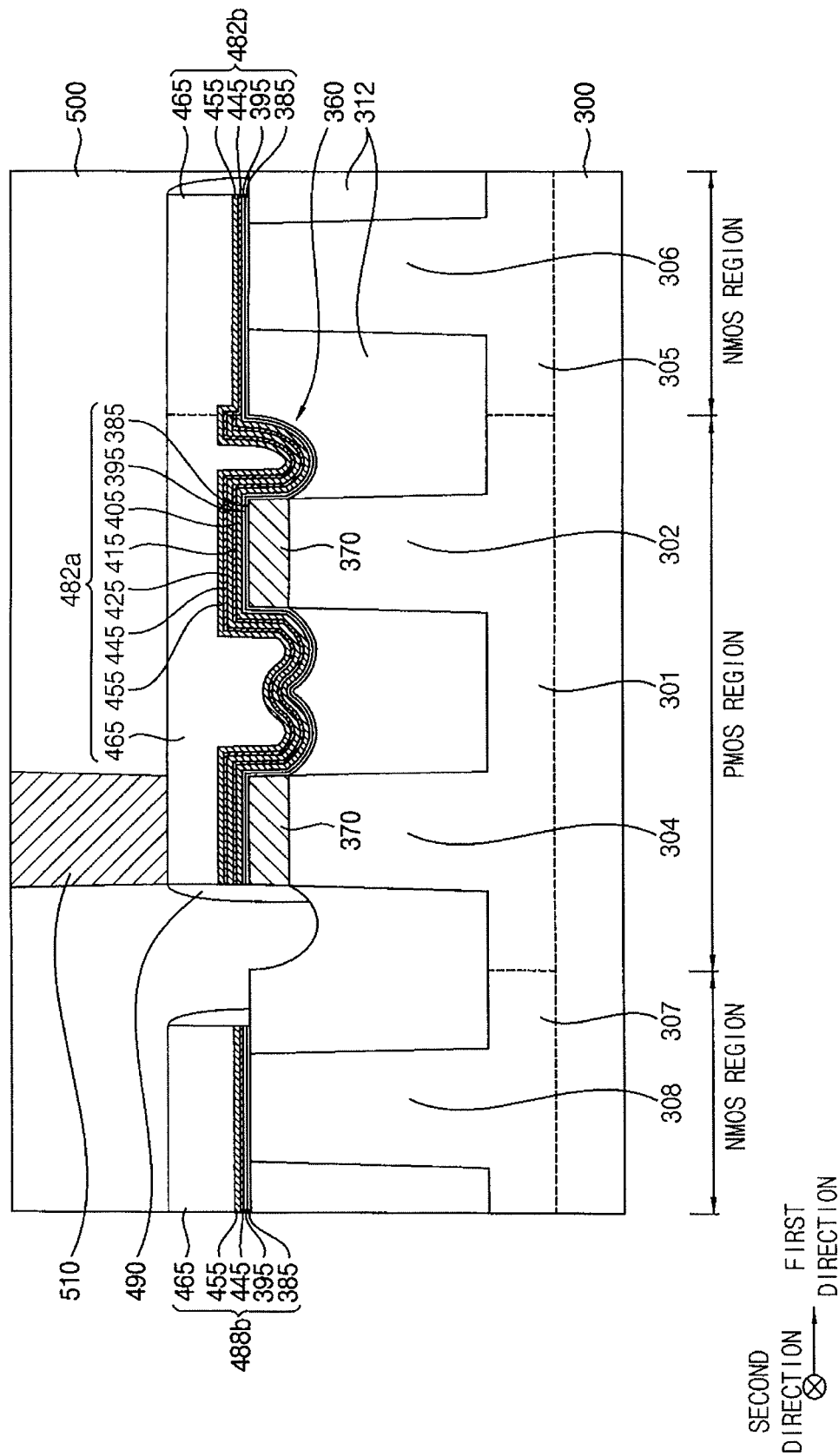
FIGS. 20 to 22 illustrate another embodiment of a semiconductor device.
Figure 21:
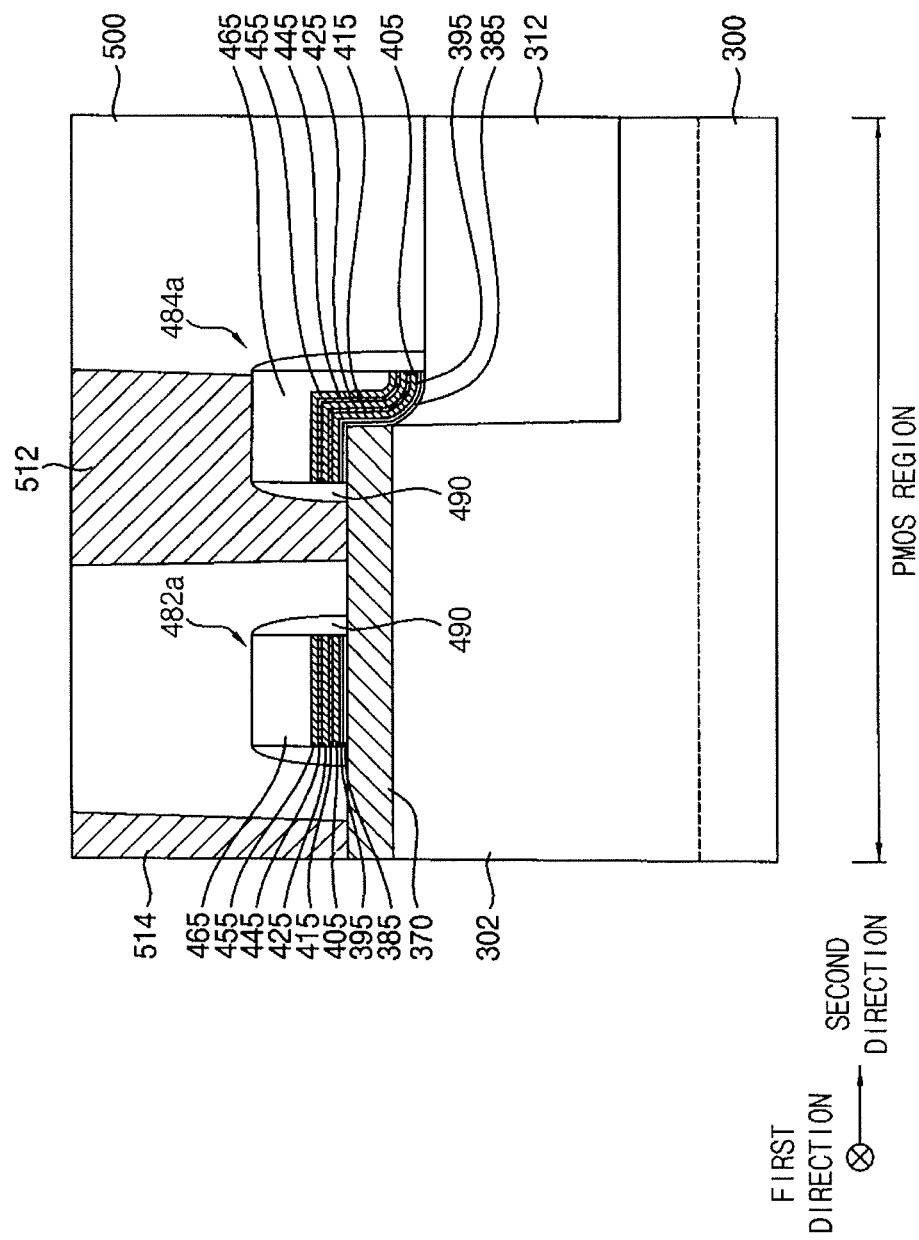
Figure 22:
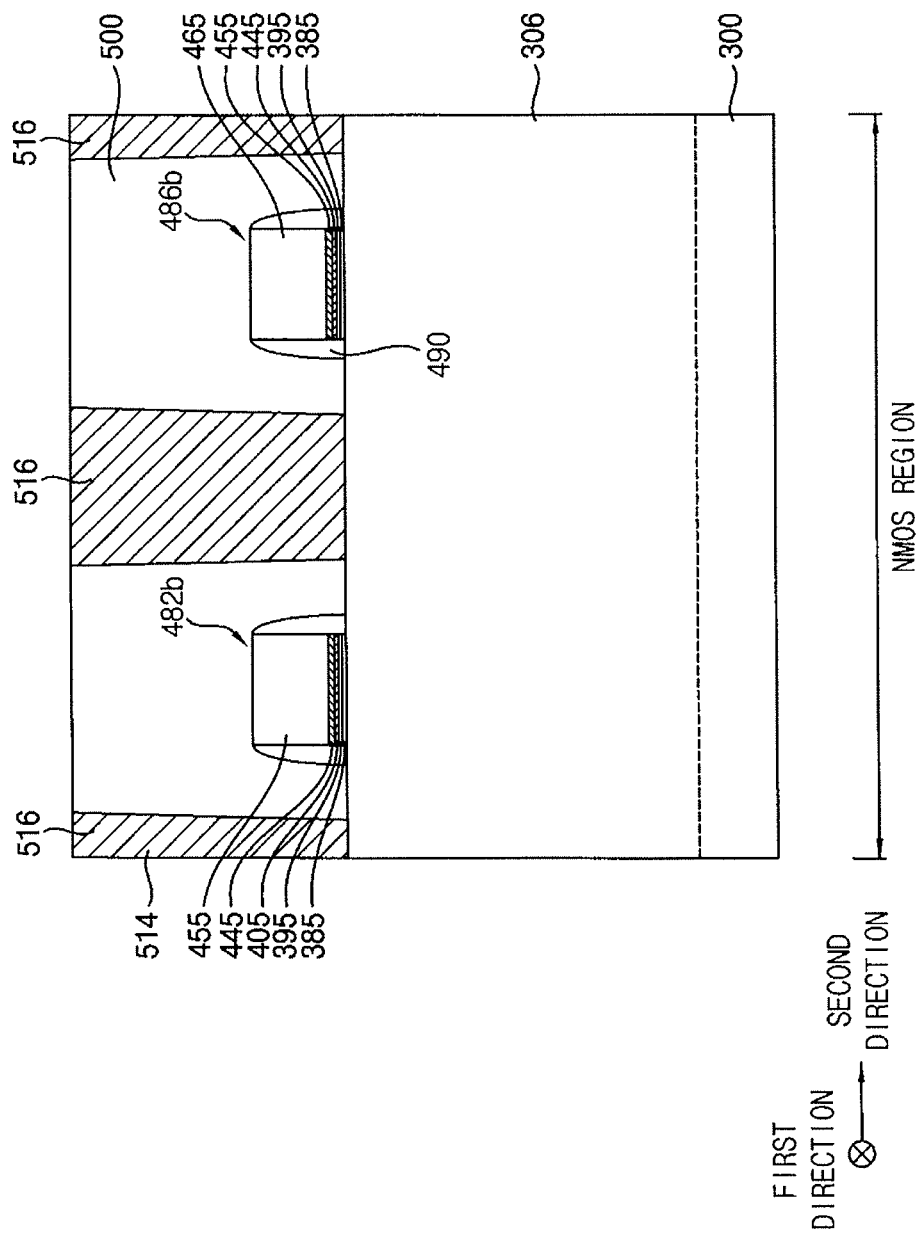
Figure 23:
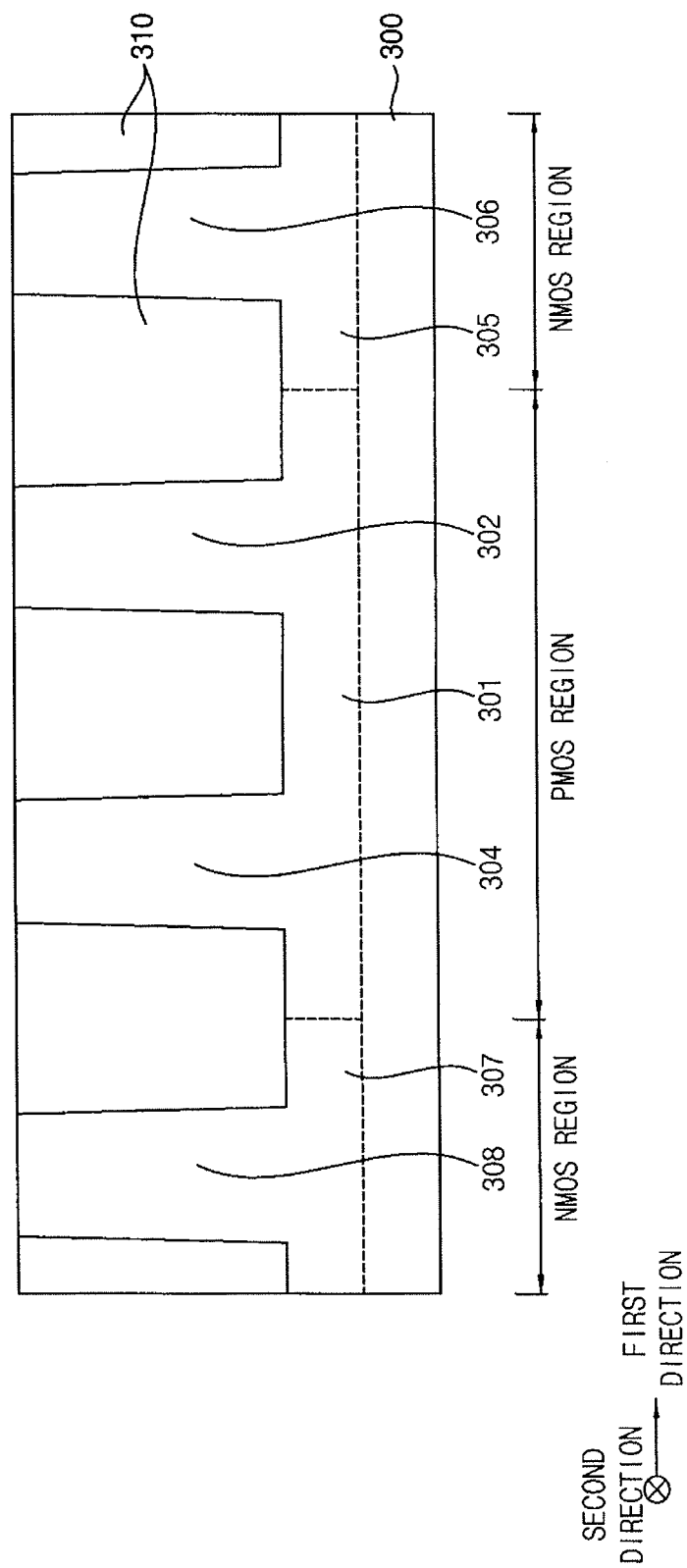
FIGS. 23 to 46 illustrate another embodiment of a method of manufacturing a semiconductor device.
Figure 24:
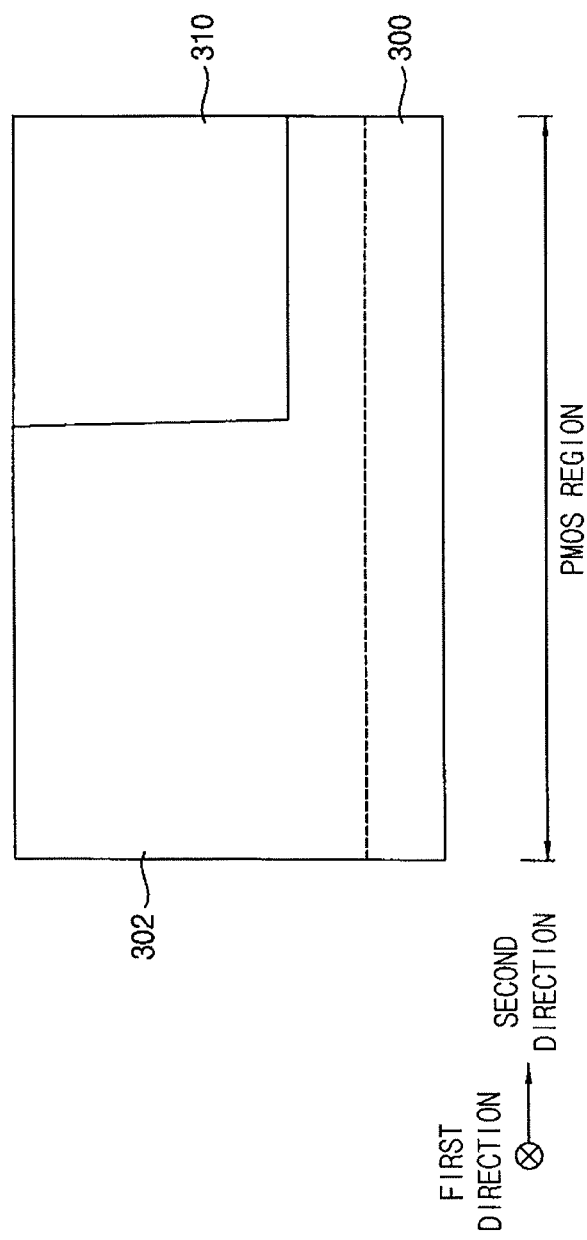
Figure 25:
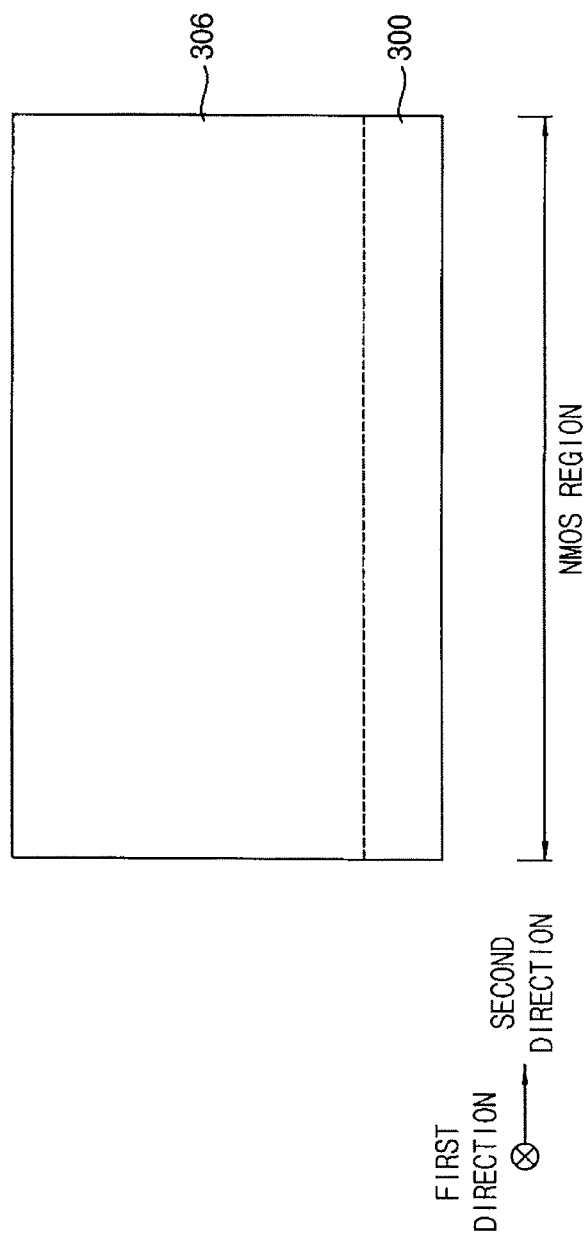
Figure 26:
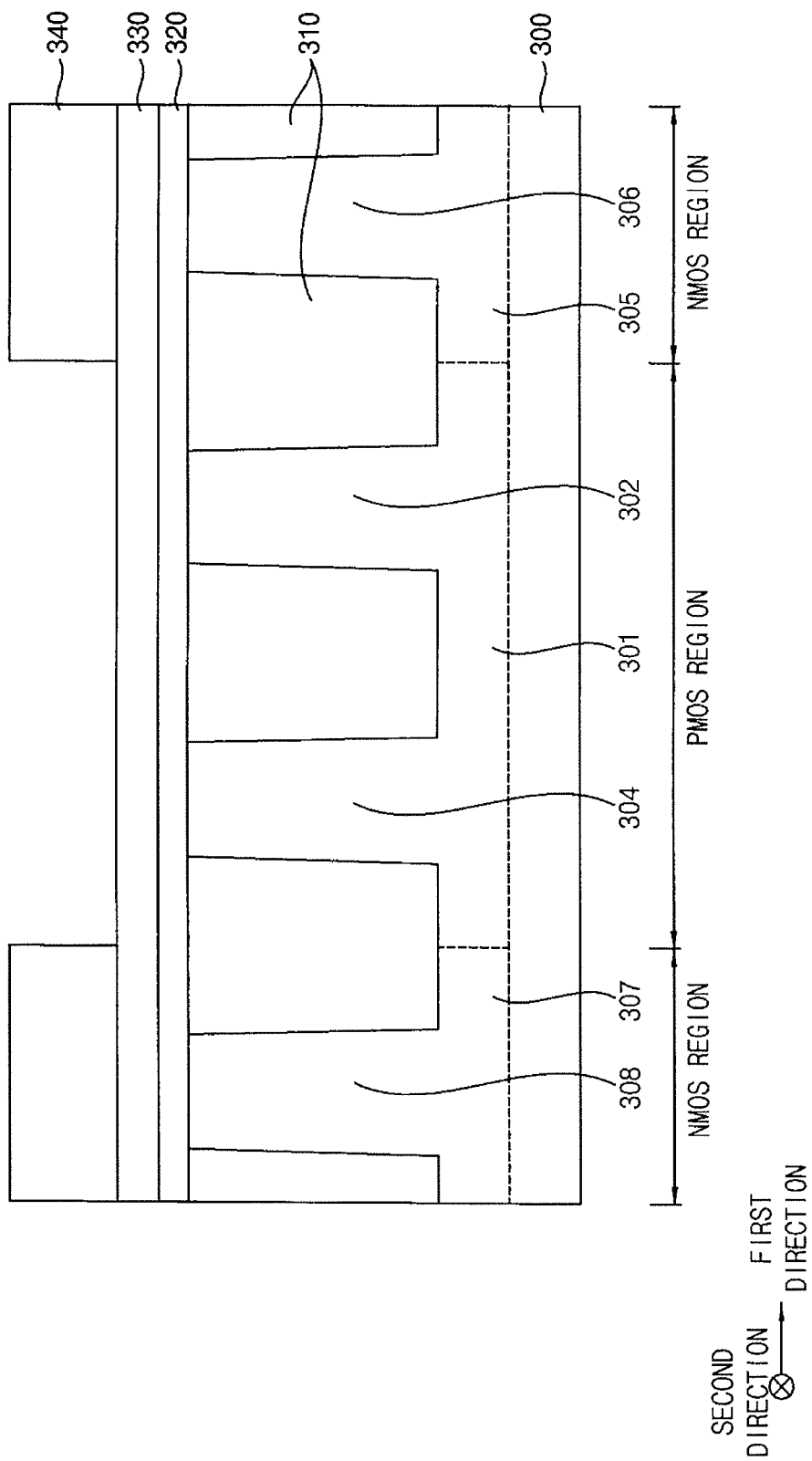
Figure 27:
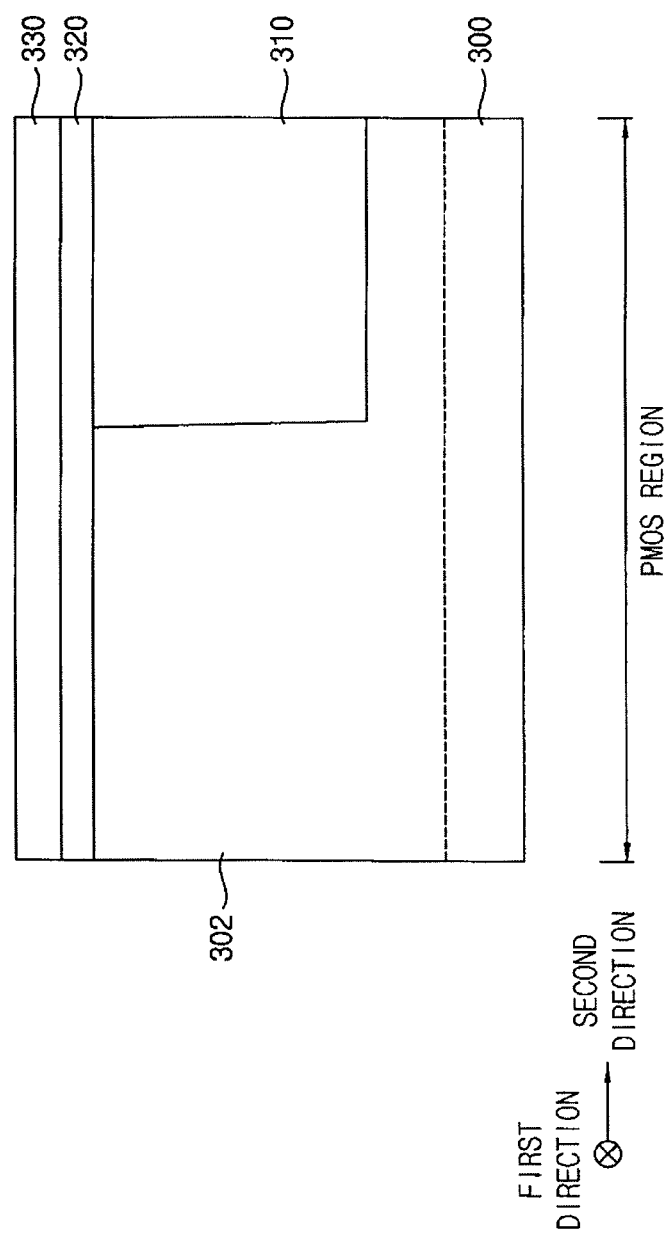
Figure 28:
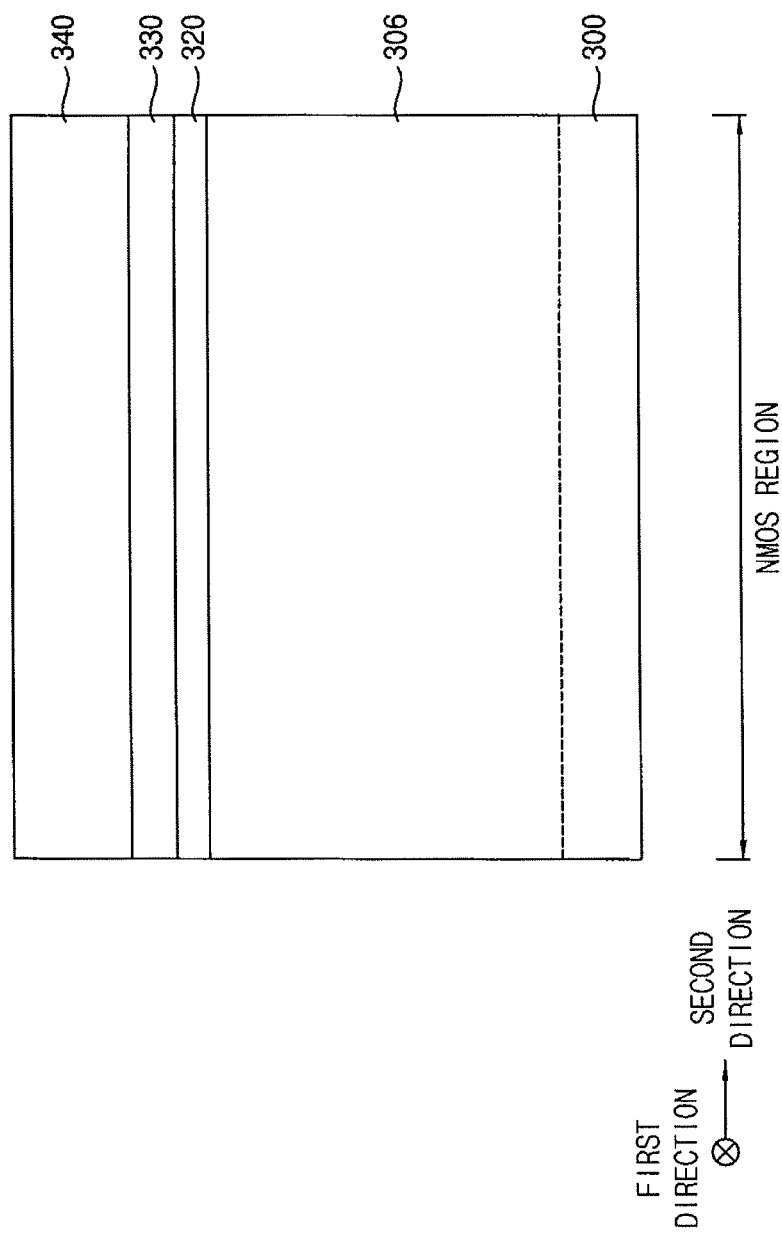
Figure 29:
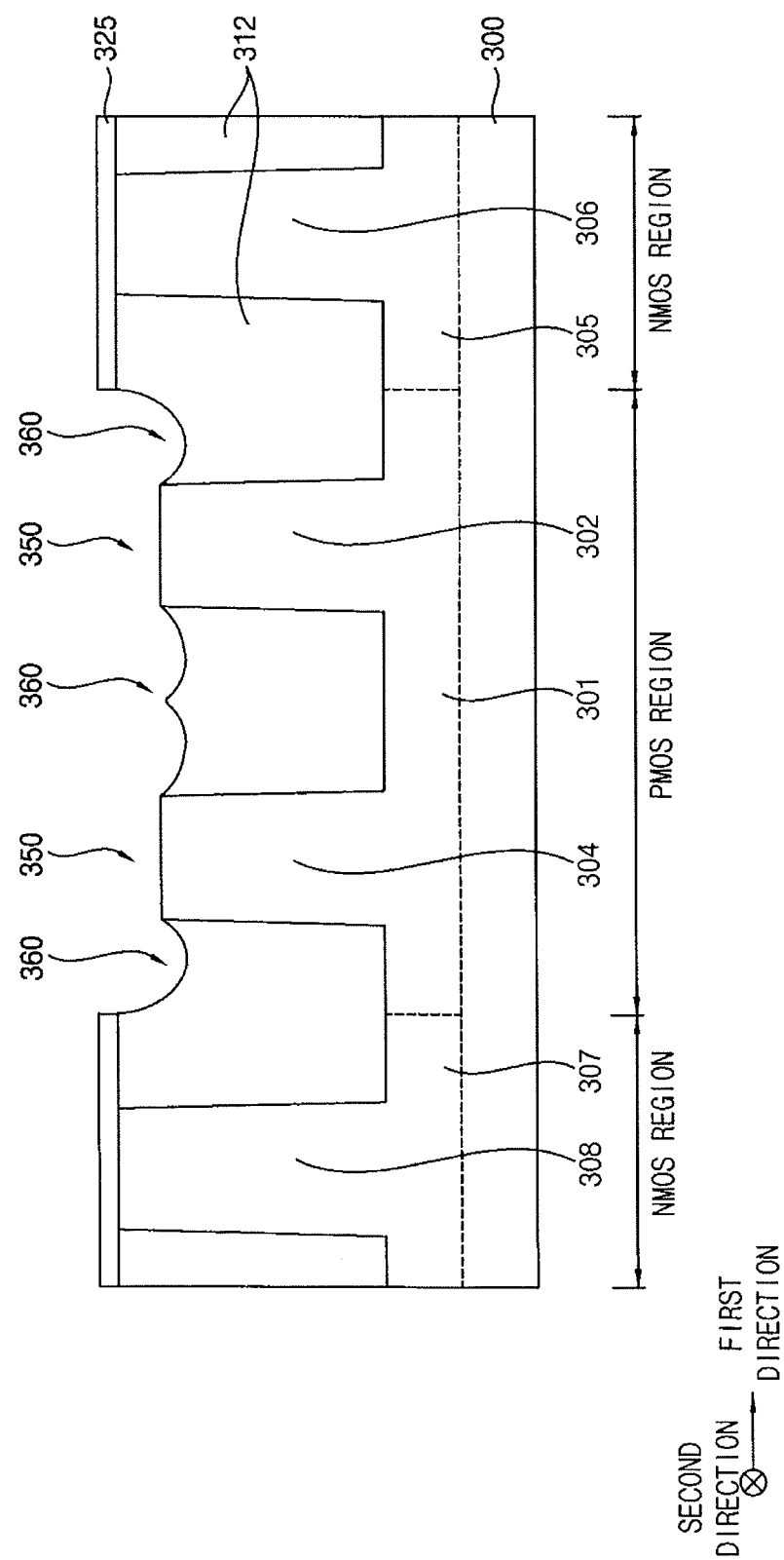
Figure 30:
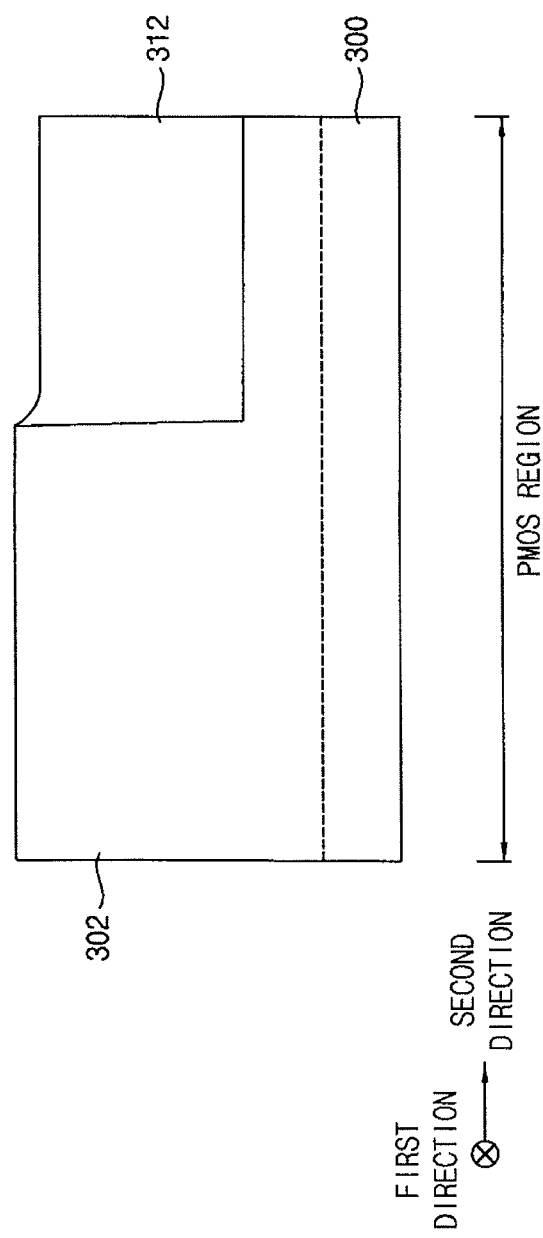
Figure 31:
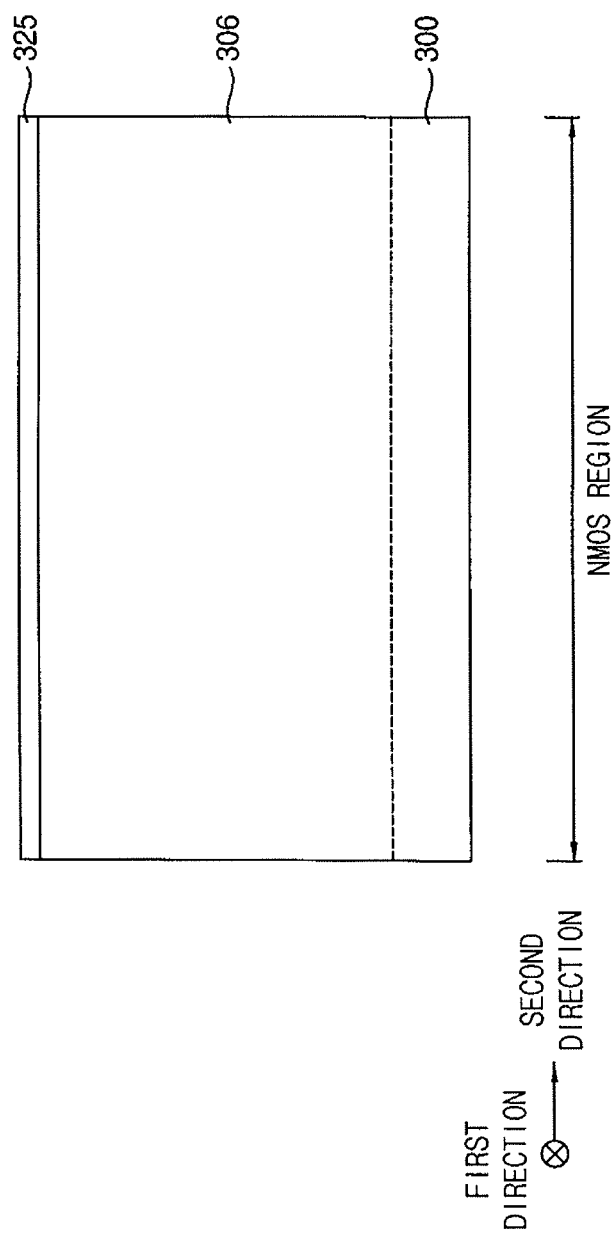
Figure 32:
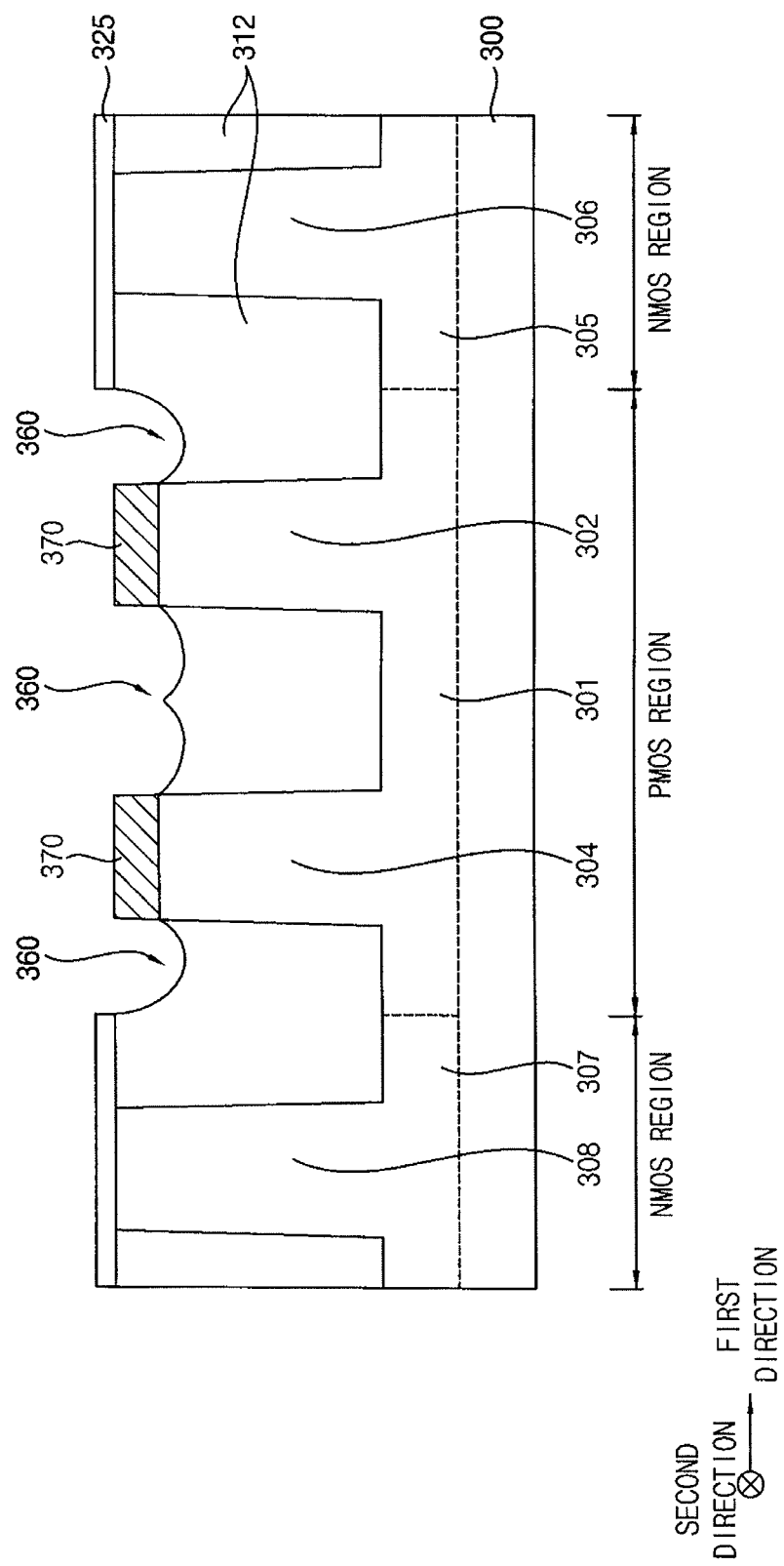
Figure 33:
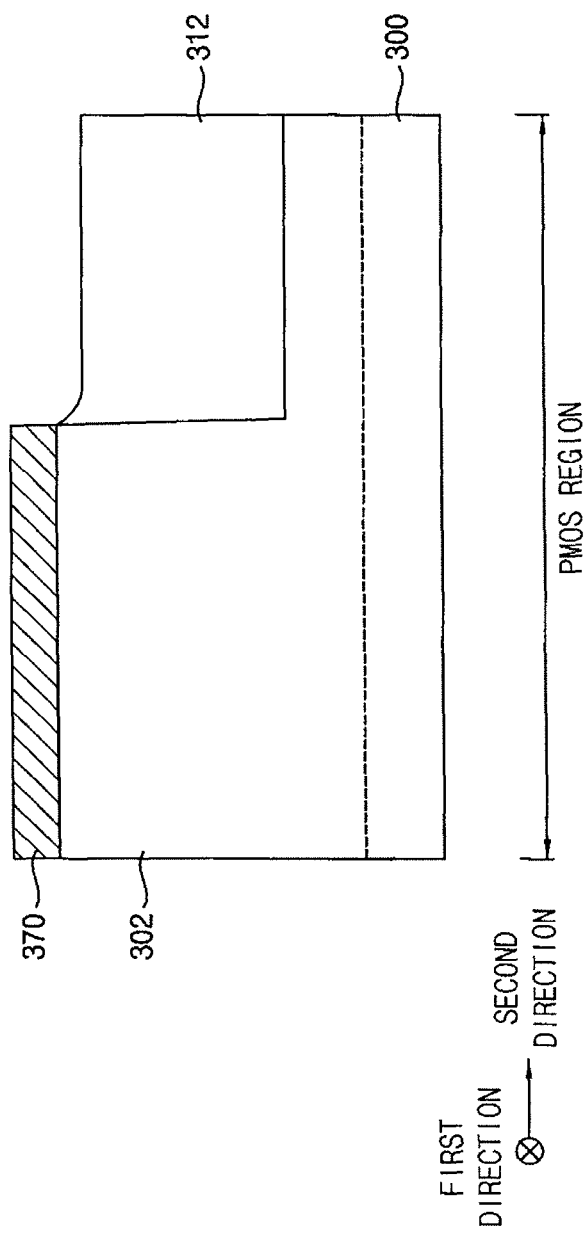
Figure 34:
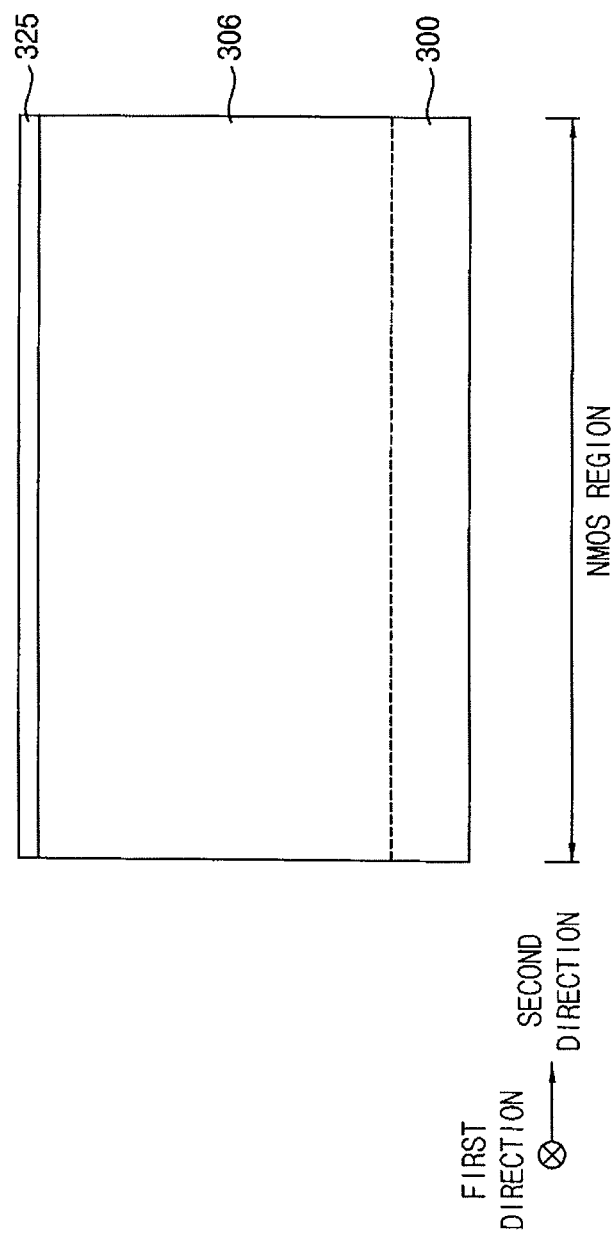
Figure 35:
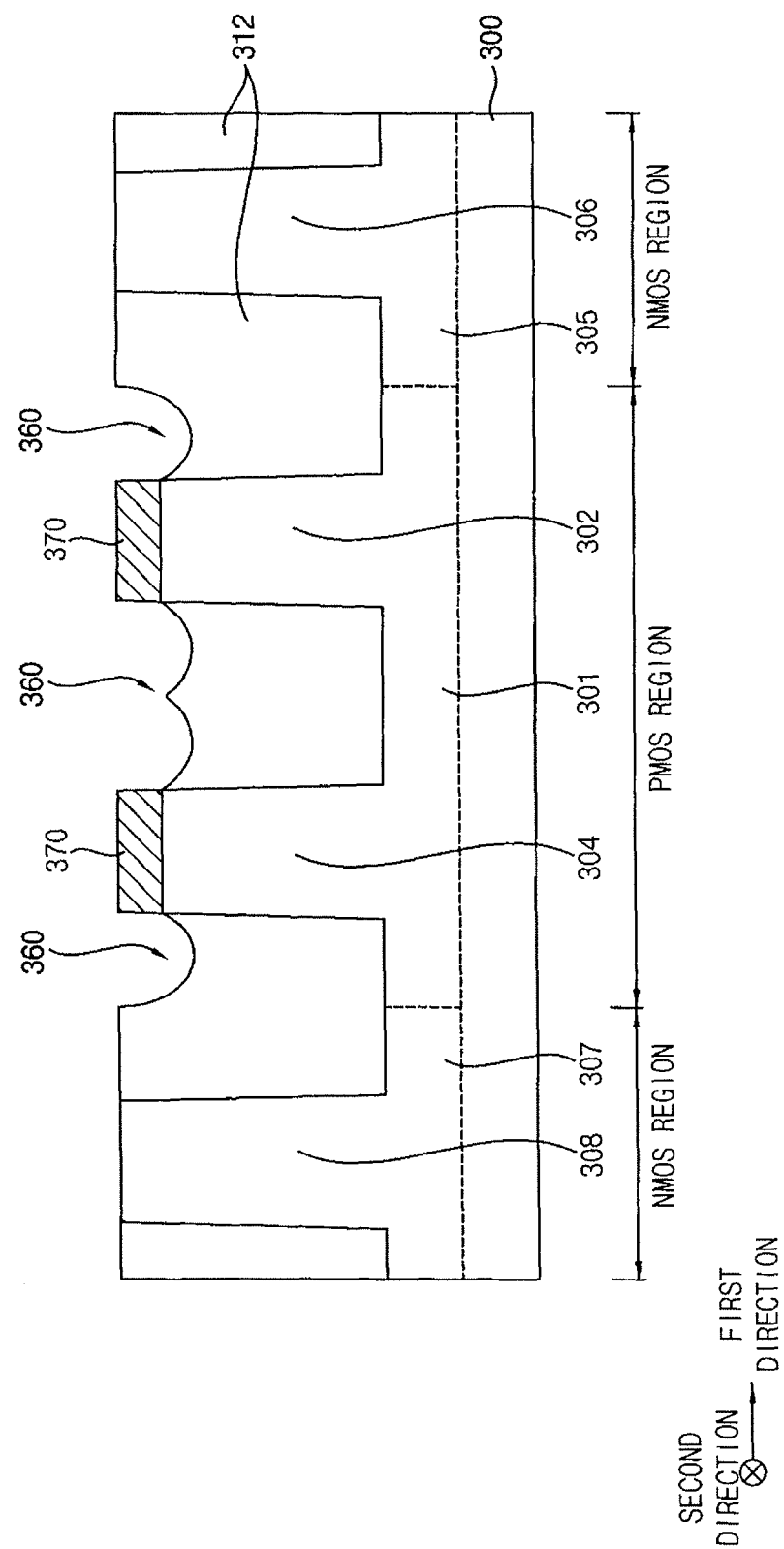
Figure 36:
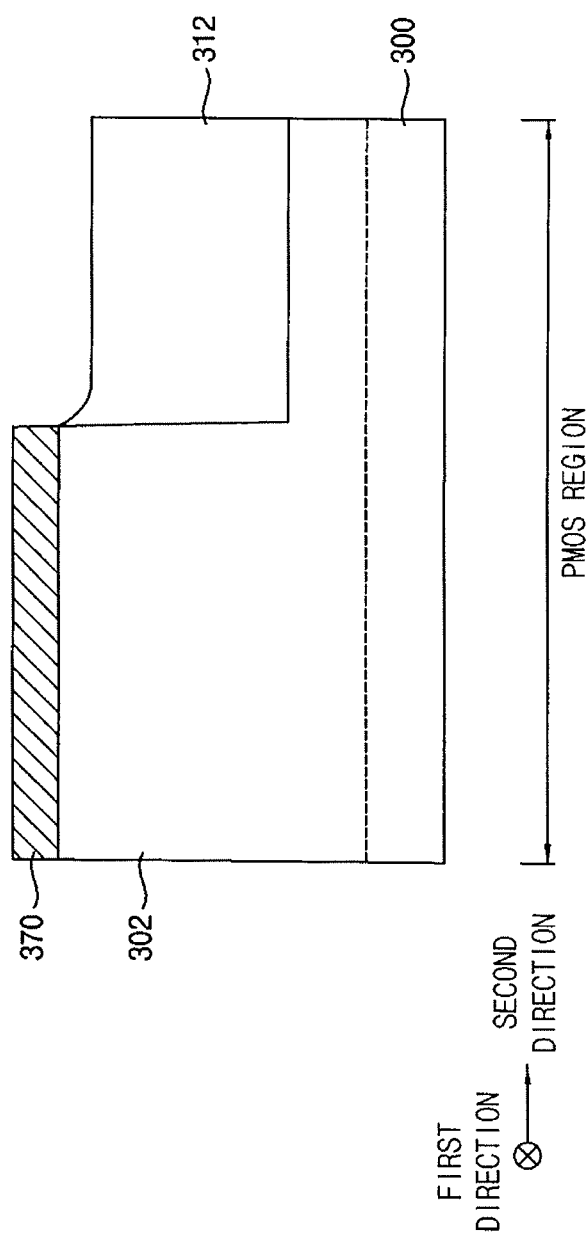
Figure 37:
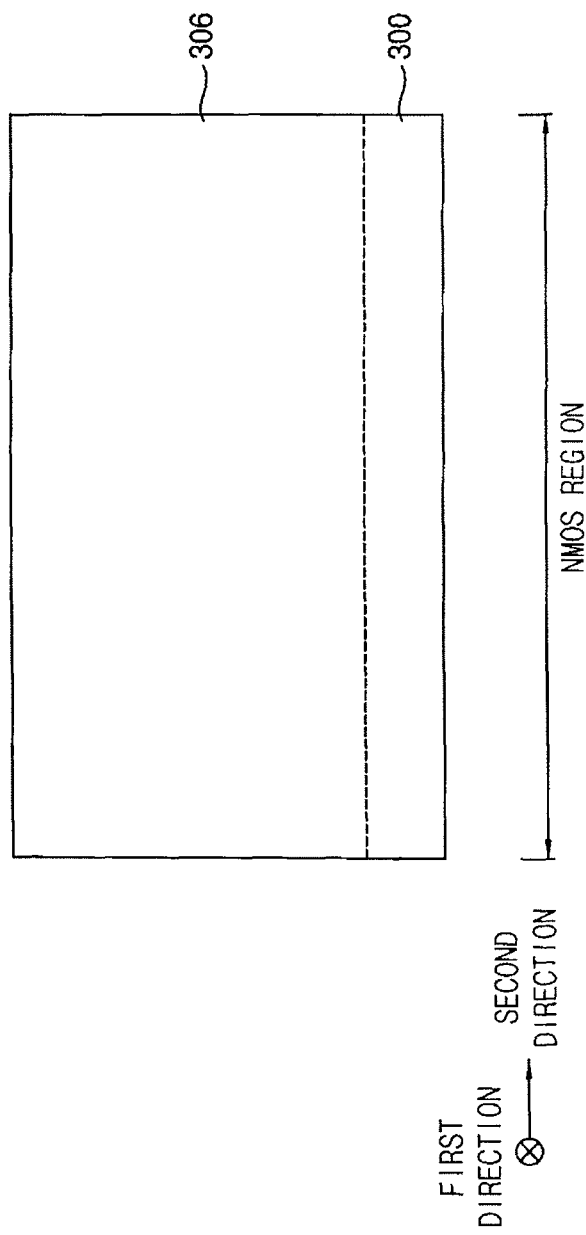
Figure 38:
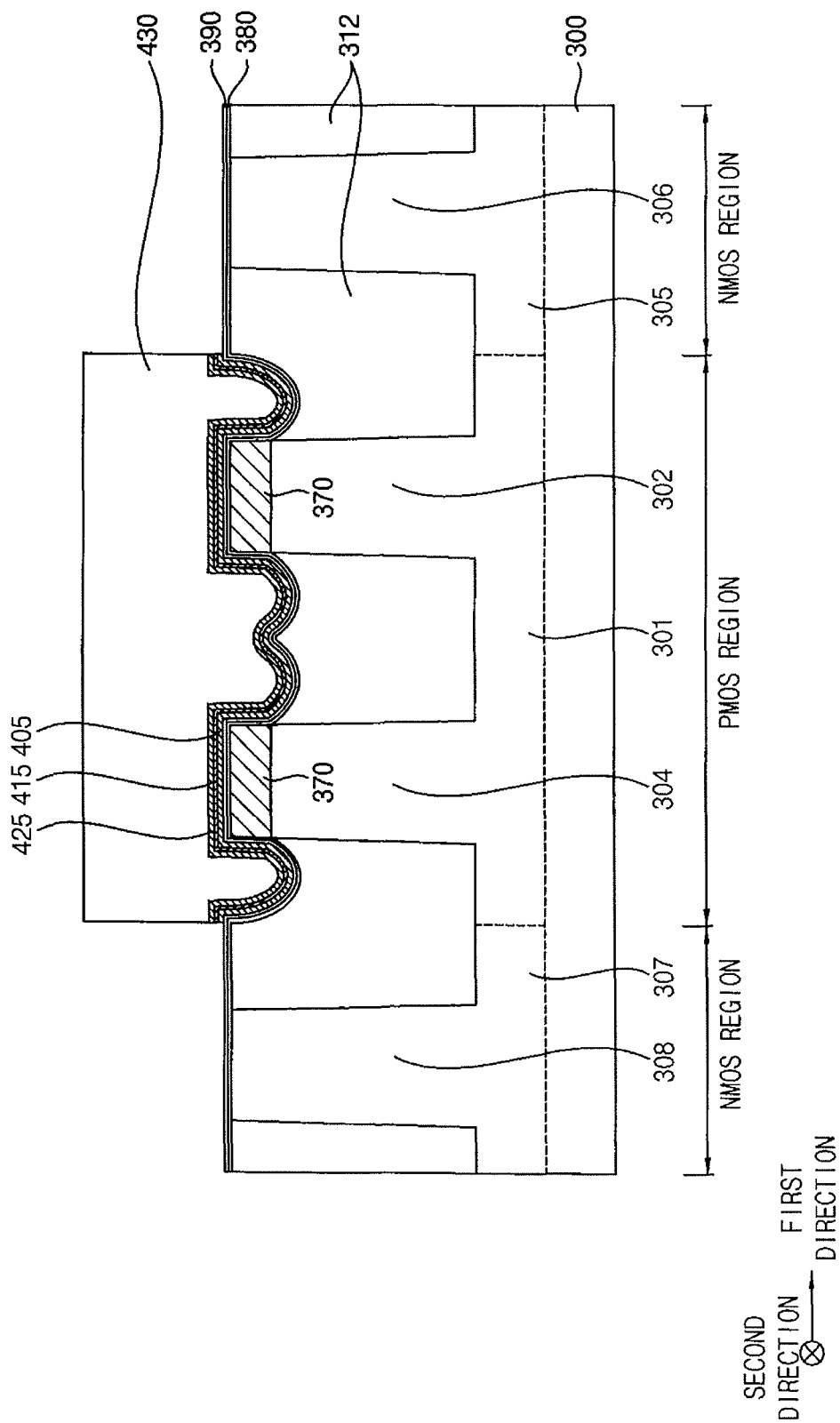
Figure 39:
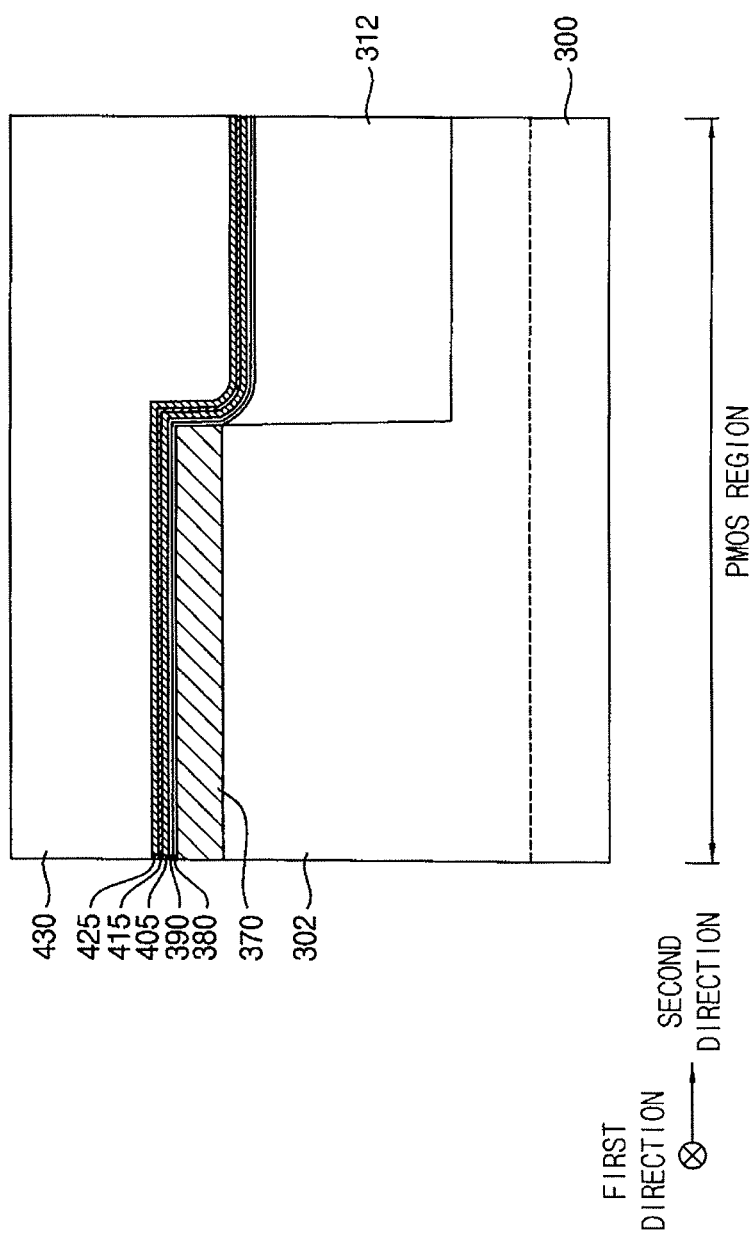
Figure 40:
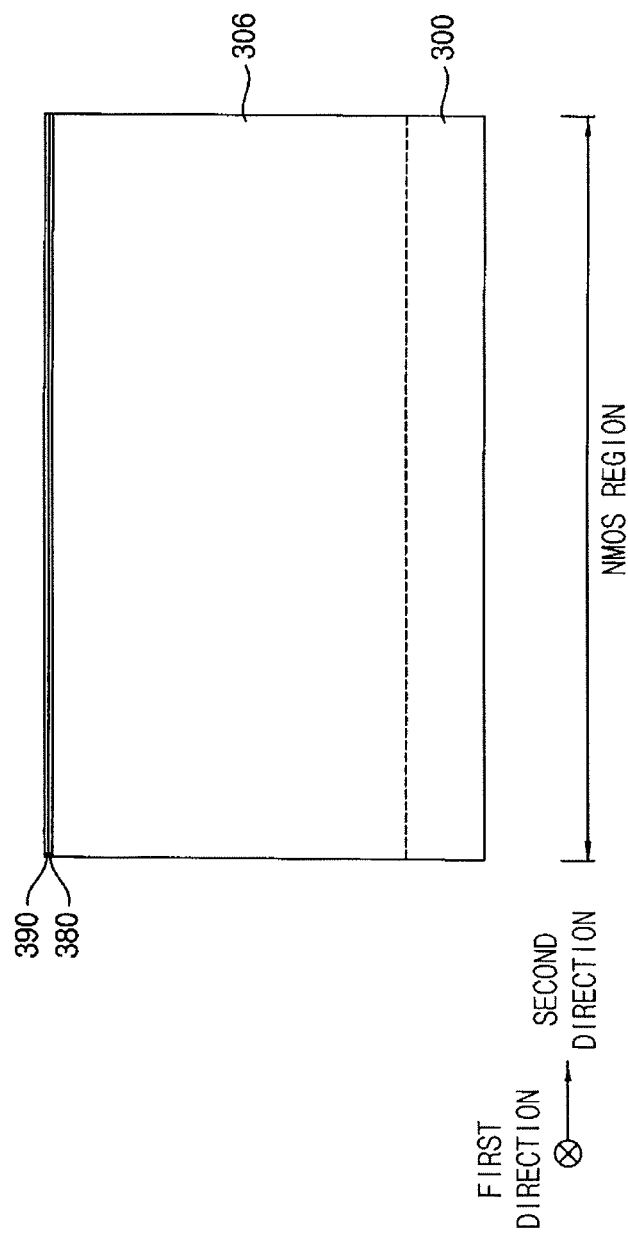
Figure 41:
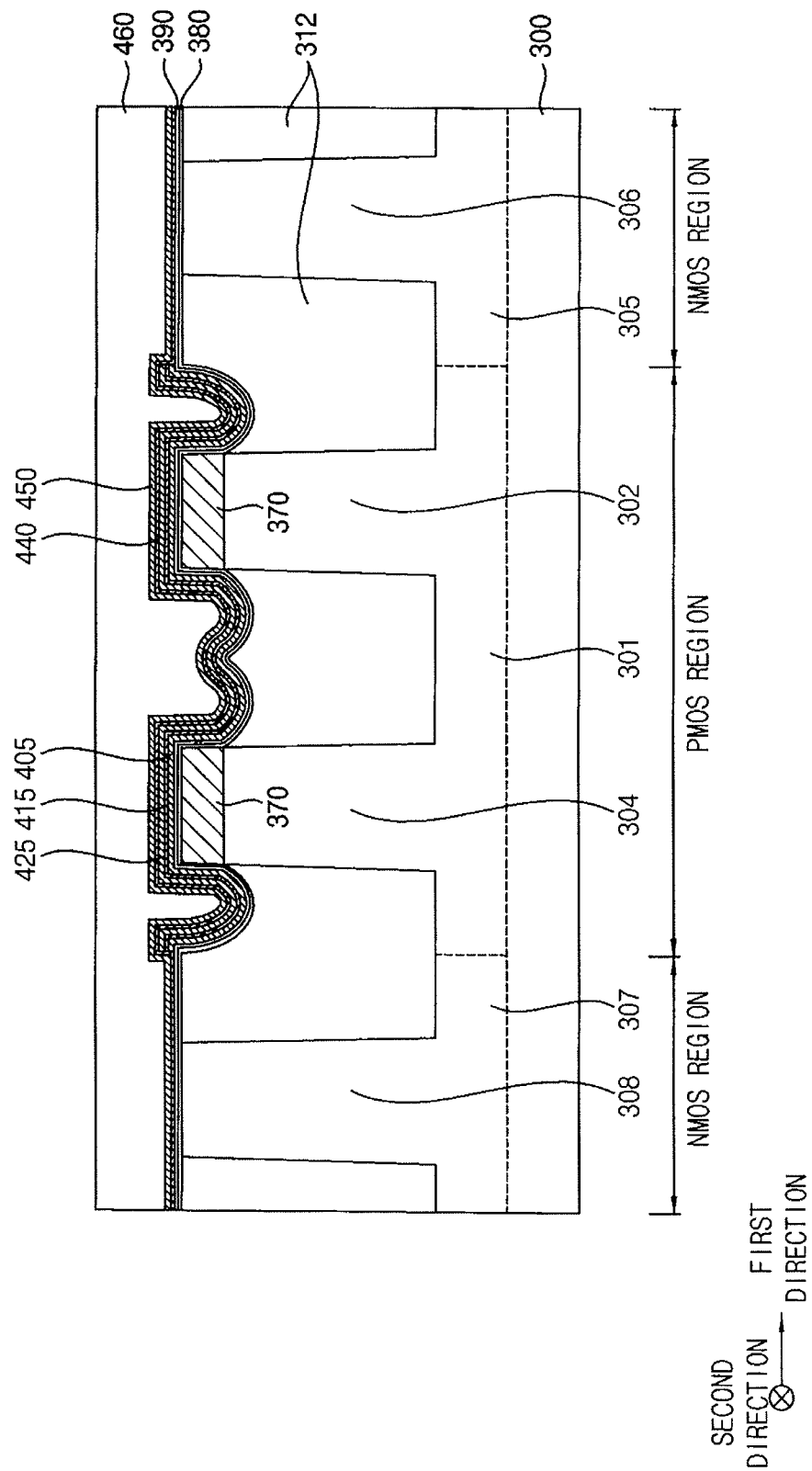
Figure 42:
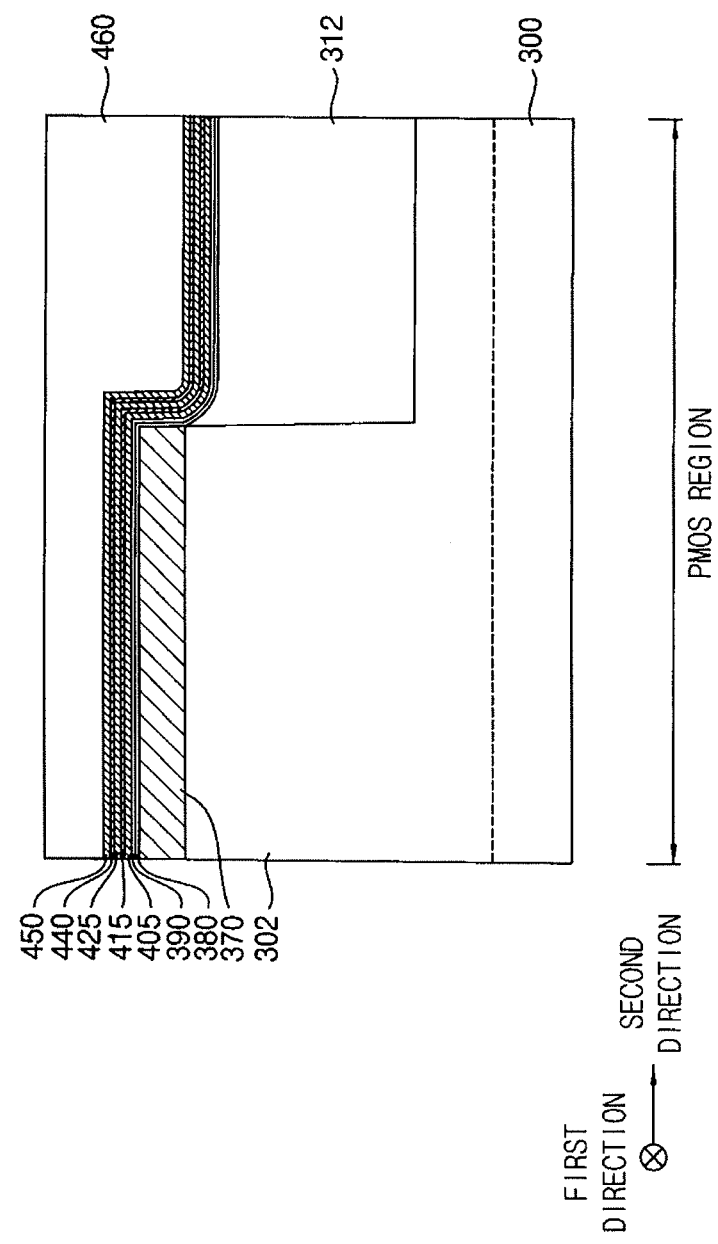
Figure 43:
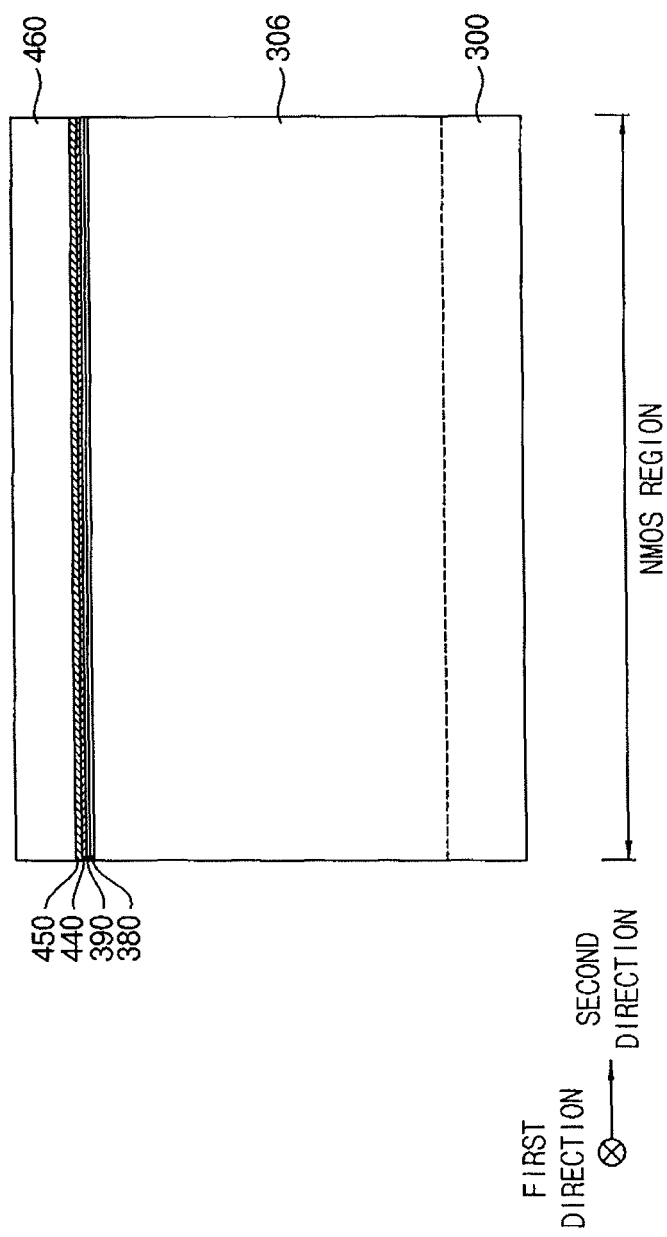
Figure 44:
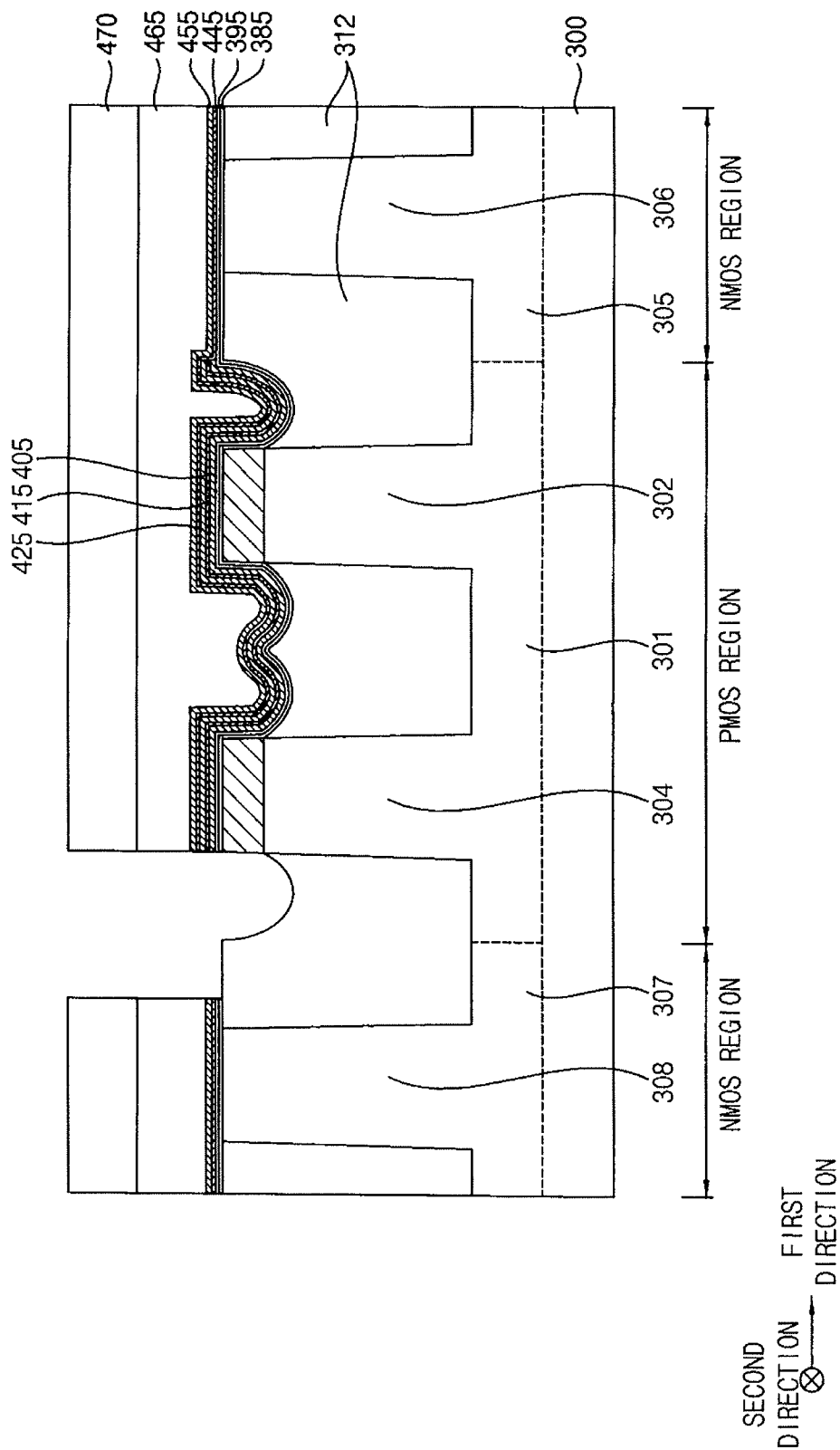
Figure 45:
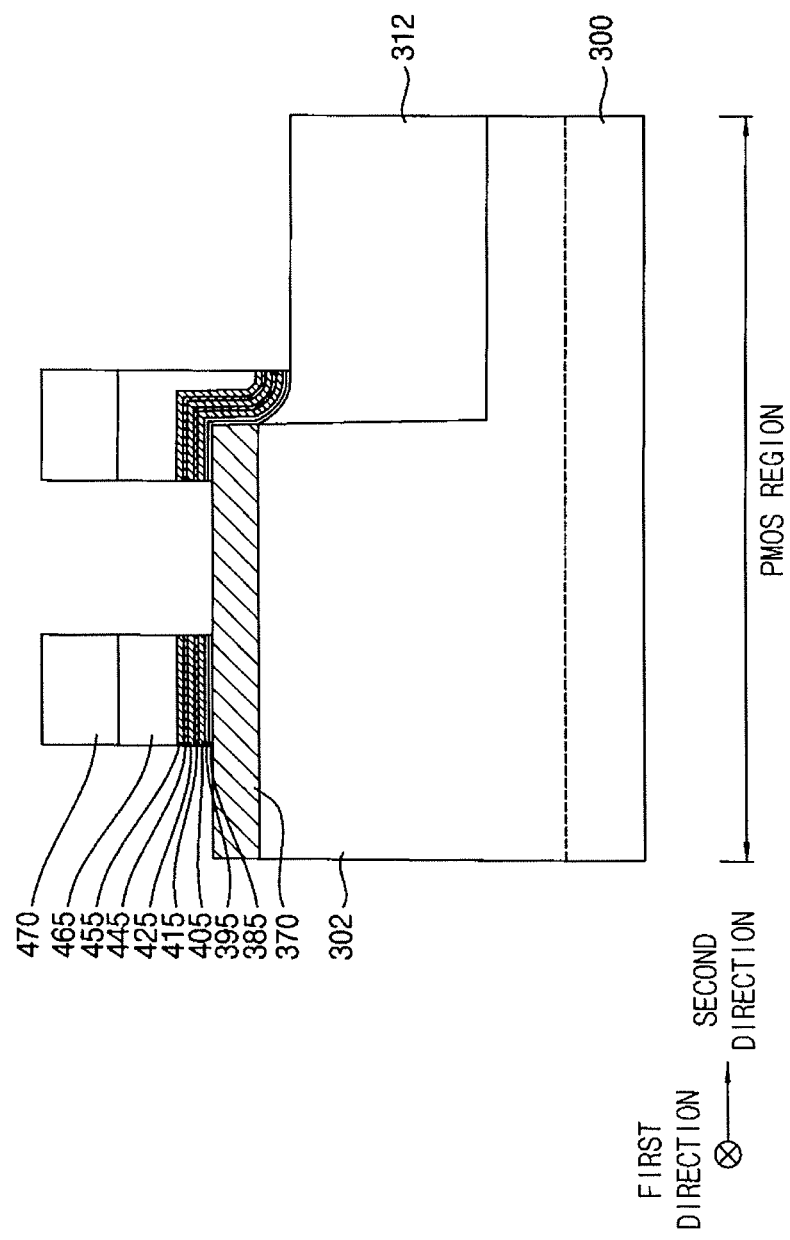
Figure 46:
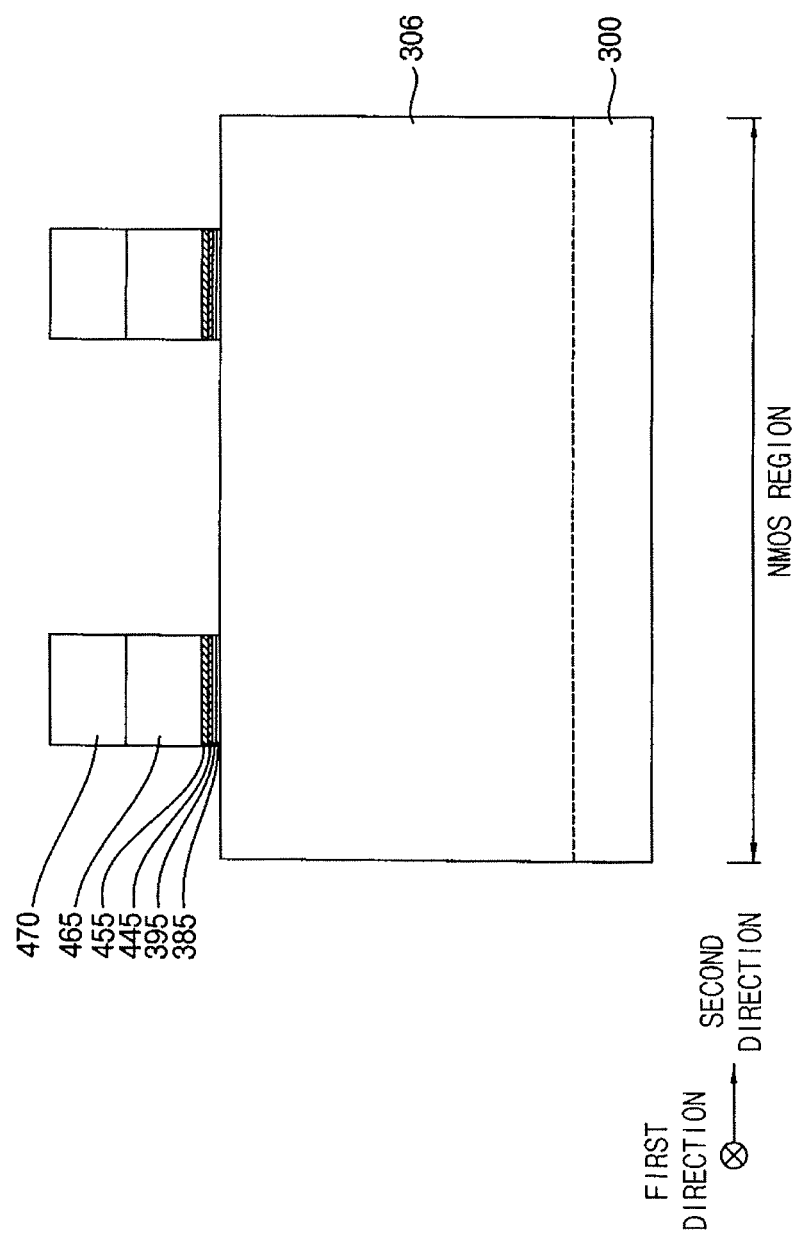

FIG. 19 illustrates a plan view of another embodiment of a semiconductor device, and FIGS. 20 to 22 are cross-sectional views of this semiconductor device. As illustrated in FIG. 19, a unit cell of a static random access memory (SRAM) device is included within a space defined by a dotted line. FIG. 20 is a cross-sectional view cut along a line I-I' in FIG. 19, FIG. 21 is a cross-sectional view cut along a line II-II' in FIG. 19, and FIG. 22 is a cross-sectional view cut along a line in FIG. 19. The SRAM device is illustrated in FIGS. 19 to 22 as the semiconductor device. However, in other embodiments, the semiconductor device may include structures substantially the same as or similar to those of the semiconductor device illustrated with reference to FIGS. 1 to 3, and thus detailed descriptions thereon are omitted herein.

Referring to FIGS. 19 to 22, the semiconductor device may include a substrate 300, a channel layer 370, first to fourth gate lines 482, 484, 486, and 488, and first to fifth contacts 510, 512, 514, 516, and 518. The semiconductor device may further include gate spacers 490 formed on sidewalls of each of the gate lines 482, 484, 486, and 488, and a bit line and a word line electrically connected to the contacts 510, 512, 514, 516, and 518.

The substrate 300 may include a semiconductor substrate, e.g. a silicon substrate, a germanium substrate and a silicon-germanium substrate, a silicon-on-insulator (SOI) substrate, a germanium on insulator (GOI) substrate, etc. A region of the substrate 300 where an isolation layer pattern 312 is formed may be defined as a field region, and a region where the isolation layer pattern 312 is not formed may be defined as an active region. In example embodiments, a plurality of active regions 308, 304, 302, and 306 may be formed on the substrate 300 along a first direction. Each of the active regions 302, 304, 306, and 308 may extend in a second direction substantially perpendicular to the first direction. Also, in example embodiments, reference numerals 302, 304, 306, and 308 may indicate first, second, third and fourth active regions, respectively. Because the isolation layer pattern 312 is formed partially on the substrate 300, each upper portion of the active regions 302, 304, 306, and 308 may protrude from the substrate 300 in a vertical direction.

Wells 301, 305, and 307 doped with p-type impurities or n-type impurities may be formed in the substrate 300. Particularly, the first well 301 may be an n-type well doped with n-type impurities, and the second and third wells 305 and 307 may be p-type wells doped with p-type impurities. Thus, the substrate 300 may include a PMOS region where the n-type well 301 is formed and an NMOS region where the p-type wells 305 and 307 are formed.

In example embodiments, the first and second active regions 302 and 304 may be defined in the first well 301, and the third and fourth active regions 306 and 308 may be defined in the second and third wells 303 and 305, respectively. Thus, the first to fourth active regions 302, 304, 306, and 308 may be included in the PMOS region and NMOS region, respectively. Also, in example embodiments, the PMOS region and the NMOS region may be formed along the first direction in an alternating pattern, and each of the PMOS region and the NMOS region may extend in the second direction.

The channel layer 370 may be formed on the upper portions of the active regions 302 and 304 in the PMOS region. The channel layer 370, for example, may include silicon-germanium. The channel layer 370 may have a variety of shapes including a tapered shape, i.e., a shape becoming narrower from a bottom portion to an upper portion. However, in other embodiments, the channel layer 370 may a shape different from a tapered shape, including, for example, one having a sidewall that is substantially perpendicular to a top surface of the substrate 300 and a flat top surface. Also, in at least one embodiment, an upper edge portion of the channel layer 370 may have a substantially round shape. Also, in example embodiments, the channel layer 370 may have the top surface substantially coplanar with top surfaces of the third and fourth active regions 306 and 308 on which no recess is formed or a top surface of the isolation layer pattern 312 in the NMOS region.

The first to fourth gate lines 482, 484, 486, and 488 may extend in the first direction and may be spaced apart from each other in the first direction. Additionally, the first gate line 482 may partially overlap the second and third gate lines 484 and 486 in the second direction. The second gate line 484 may partially overlap the first and fourth gate lines 482 and 488 in the second direction. In a unit memory cell, the first and second gate lines 482 and 484 may extend over the PMOS region and the NMOS region, and the third and fourth gate lines 486 and 488 may extend over the NMOS region.

Each of the gate lines 482, 484, 486, and 488 may have a structure where a portion formed in the PMOS region and a portion formed in the NMOS region are different from each other. Thus, the portion corresponding to the gate line formed in the PMOS region may be designated as a first gate structure, and a portion corresponding to the gate line formed in the NMOS region may be designated as a second gate structure.

The first gate structure 482a may include a gate insulation layer pattern, a first work function control layer pattern, a second work function control layer pattern, and a doped polysilicon layer pattern sequentially stacked on the channel layer 370, as well as a portion of the isolation layer pattern 312, in the PMOS region. Also, the second gate structure 488b may include the gate insulation layer pattern, the second work function control layer pattern, and the doped polysilicon layer pattern sequentially stacked on the active regions 306 and 308, and a portion of the isolation layer pattern 312 in the NMOS region.

The gate insulation layer pattern may include a low-k dielectric layer pattern 385 and a high-k dielectric layer pattern 395 sequentially stacked. The first work function control layer pattern may include a first barrier layer pattern 405, a first metal layer pattern 415, and a second barrier layer pattern 425 sequentially stacked. The second work function control layer pattern may include a second metal layer pattern 445 and a third barrier layer pattern 455 sequentially stacked. The first and second gate structures 482a and 488b may not be limited to the above-described ones, and may have various other constructions as PMOS and NMOS gate structures, respectively.

First and second source/drain regions may be formed at upper portions of the active regions 302, 304, 306, and 308 adjacent to the first and second gate structures 482a and 488b, respectively. Thus, the first gate structure and the first source/drain region may form a PMOS transistor, and the second gate structure and the second source/drain region may form an NMOS transistor.

In example embodiments, the PMOS transistor may be a pull-up transistor, and one of the NMOS transistors including a gate structure included in the first and second gate lines 482 and 484 may be a pull-down transistor. Also, one of the NMOS transistors may include a gate structure included in the third and fourth gate lines 486 and 488 and may be a pass-gate transistor.

A groove 360 may be formed on the isolation layer pattern 312 adjacent to the channel layer 370, i.e. a portion of the isolation layer pattern 312 within the PMOS region, and at least a portion of a bottom surface of the groove 360 may be lower than a bottom surface of the channel layer 370.

Due to the groove 260 formed on the isolation layer pattern 112, the first gate structure 482a in the PMOS region may cover not only a top surface of the channel layer 370 but also a sidewall thereof. Therefore, an area of the first gate structure contacting the channel layer 370 may be relatively increased. Accordingly, the PMOS transistor may have an improved performance, e.g. a decreased leakage current. Additionally, the threshold voltage mismatch between the PMOS transistor and the NMOS transistor may be reduced.

Contacts 510, 512, 514, 516, and 518 may penetrate an insulating interlayer 500 covering the gate lines 482, 484, 486, and 488 and contact the first and second source/drain regions and/or the gate lines 482, 484, 486 and 488. Particularly, the first contact 510 may contact the first source/drain region on the first gate line 482 and the second active region 304, the second contact 512 may contact the first source/drain region on the second gate line 482 and the first active region 302, the third contact 516 may contact the second source/drain region of the third active region 306, and the fourth contact 518 may contact the second source/drain region of the fourth active region 308. In other words, each of the first and second contacts 510 and 512 may be a shared contact. FIGS. 19 to 22 illustrate an embodiment of one of the unit memory cell structures of the SRAM device. However, the unit memory cell structure may be different in other embodiments.

FIGS. 23 to 46 illustrate cross-sectional views of stages of another embodiment of a method of manufacturing a semiconductor device. The methods may be used for manufacturing the semiconductor device illustrated with reference to FIGS. 19 to 22 or a different semiconductor device. Particularly, FIGS. 23, 26 29, 32, 35, 38, 41, and 44 are cross-sectional views cut along a line I-I' in FIG. 19, FIGS. 24, 27, 30, 33, 36, 39, 42, and 45 are cross-sectional views cut along a line in FIG. 19, and FIGS. 25, 28, 31, 34, 37, 40, and 43 are cross-sectional views cut along a line III-III' in FIG. 19. The method may contain identical or similar processes to the method illustrated with reference to FIGS. 4 to 17, and therefore detailed descriptions thereon are omitted herein.

Referring to FIGS. 19 and 23 to 25, an isolation layer 310 may be formed on a substrate 300 and wells 301, 305 and 307 may be formed by implanting impurities in the substrate 300.

The substrate 300 may include at least one active region and at least one field region, and an isolation layer 310 between the active and field regions. In example embodiments, a plurality of active regions 308, 304, 302, and 306 may be formed on the substrate 300 in a first direction. Each of the active regions 302, 304, 306, and 308 may extend in a second direction substantially perpendicular to the first direction. In example embodiments, reference numerals 302, 304, 306, and 308 may indicate first, second, third and fourth active regions, respectively.

Wells 301, 305, and 307 may be formed by doping p-type impurities or n-type impurities in the substrate 100. Particularly, n-type impurities may be doped in the substrate 300 to form the n-type first well 301, and p-type impurities may be doped in the substrate 300 to form the p-type second and third wells 305 and 307. Thus, the substrate 300 may include a PMOS region in which the n-type well 301 is formed and an NMOS regions in which p-type wells 305 and 307 are formed. In example embodiments, the first and second active regions 302 and 304 may be defined in the first well 301, and the third and fourth active regions 306 and 308 may be defined in the second and third wells 305 and 307, respectively. Thus, the first to fourth active regions 302, 304, 306, and 308 may be included in the PMOS region and NMOS region, respectively.

In example embodiments, the PMOS region and the NMOS region may be formed in the first direction in an alternating pattern, and each of the PMOS region and the NMOS region may extend in the second direction. An impurity doping process may be further performed on each of the active regions 302, 304, 306, and 308 to form channels at upper portions thereof.

Referring to FIG. 19 and FIGS. 26 to 28, a process substantially identical or similar to the process illustrated with reference to FIG. 5 may be performed. Therefore, a mask layer 320 and a buffer layer 330 may be formed sequentially on the substrate 300 and the isolation layer 310, and a first photoresist pattern 340 may be formed on the buffer layer 330.

In example embodiments, the first photoresist pattern 340 may extend in the second direction and may be formed to cover the NMOS region and to leave the PMOS region exposed. In other words, the first photoresist pattern 340 may be formed to cover the third and fourth active regions 306 and 308 and a portion of the isolation layer 310 in the NMOS region and to expose the first and second active regions 302 and 304 and a portion of the isolation layer 310 in the PMOS region.

Referring to FIG. 19 and FIGS. 29 to 31, processes substantially identical or similar to the processes illustrated with reference to FIGS. 6 to 9 may be performed. In example embodiments, exposed upper portions of the first and second active regions 302 and 304 may be etched to form a recess 350, and a portion of the isolation layer 310 not covered by an etch mask 325 in the PMOS region may be also etched to form a groove 360. Therefore, the isolation layer 310 may be transformed into an isolation pattern 312. Hereinafter, for convenience, not only the portion of the isolation layer 310 where the groove 360 is formed in the PMOS region, but also a portion of the isolation layer 310 where the groove 360 is not formed, may be referred to as the isolation layer pattern 312.

In example embodiments, the recess 350 may have a flat bottom surface. The groove 360 may be in fluid communication with the recess 350 and at least a portion of a bottom surface of the groove 360 may be formed to be lower than that of the recess 350. The isolation layer pattern 312 between the first and second active regions 302 and 304 may have a W-shaped groove 360 as shown in the figure depending on the etching solution and the distance to the etch mask 325. Otherwise, the isolation layer pattern 312 may have a simply concave shaped groove similar to that of the isolation pattern 312 located between the first and second active regions 302 and 306.

Referring to FIG. 19 and FIGS. 32 to 34, processes substantially identical or similar to the process illustrated with reference to FIGS. 10 and 11 may be performed. Thus, a channel layer 370 filling the recess 350 may be formed on the exposed the first and second active regions 302 and 304. The channel layer 370 may be formed to include sidewalls substantially perpendicular to a top surface of the substrate 300 and a flat top surface. However, an upper edge portion of the channel layer 370 may have a substantially round shape. In example embodiments, the channel layer 370 may be formed to have the top surface substantially coplanar with those of the third and fourth active regions 306 and 308 on which no recess is formed or a top surface of the isolation layer pattern 312 in the NMOS region.

Referring to FIG. 19 and FIGS. 35 to 37, a process substantially identical or similar to the process illustrated with reference to FIG. 12 may be performed. The etch mask 325 may be removed to expose the third and fourth active regions 306 and 308 and the portion of the isolation layer pattern 312 in the NMOS region.

Referring to FIG. 19 and FIGS. 38 to 40, processes substantially identical or similar with the processes illustrated with reference to FIGS. 13 to 15 may be performed. In other words, a gate insulation layer and a first work function control layer may be formed on the channel layer 370, the third and fourth active regions 306 and 308 and isolation layer pattern 312, and the first work function control layer may be patterned using a second photoresist pattern 430 as an etching mask to form a first work function control layer pattern. In example embodiments, the second photoresist pattern 430 may be formed as two pieces spaced apart from each other in the second direction, and each piece of the second photoresist pattern 430 may be extended in the first direction to a certain distance to overlap a portion of the PMOS.

Thus, a low-k dielectric layer 380, a high-k dielectric layer 390, a first barrier layer pattern 405, a first metal layer pattern 415, and a second barrier layer pattern 425 may be sequentially stacked on a portion of the substrate 300 in the PMOS region. The low-k dielectric layer 380 and the high-k dielectric layer 390 may be sequentially stacked on the other portions of the substrate 300.

Referring to FIG. 19 and FIGS. 41 to 43, a process substantially identical or similar to the process illustrated with reference to FIG. 16 may be performed. Thus, a second work function control layer and a doped polysilicon layer 460 may be sequentially formed on the first work function control layer pattern and the gate insulation layer. The second work function control layer may include a second metal layer 440 and a third barrier layer 450 sequentially stacked.

Referring to FIG. 19 and FIGS. 44 to 46, a process substantially identical or similar to the process illustrated with reference to FIG. 17 may be performed. The doped polysilicon layer 460, the second work function control layer, the first work function control layer pattern, and the gate insulation layer may be patterned by an etching process. This etching process may use a third photoresist pattern 470 covering portions of the PMOS region and the NMOS region as an etching mask to form the gate insulation layer pattern, the first work function control layer pattern, the second work function control layer pattern, and the doped polysilicon layer pattern 465 sequentially stacked on the channel layer 370 and the isolation layer pattern 312 in the portion of the PMOS region. This etching process may also form the gate insulation layer pattern 312, the second work function control pattern and the doped polysilicon layer pattern 465 sequentially stacked on the third and fourth active regions 306 and 308 and the isolation layer pattern 312 in the portion of the NMOS region.

In example embodiments, the third photoresist pattern 470 may be formed as four sections spaced apart from each other in a unit memory cell. Each section of the third photoresist pattern 470 may extend in the first direction to overlap portions of the PMOS region and the NMOS region.

In example embodiments, the gate insulation pattern may include a low-k dielectric layer 385 and a high-k dielectric layer 395 sequentially stacked. The first work function control layer pattern may include a first barrier layer pattern 405, a first metal layer pattern 415, and a second barrier layer pattern 425 sequentially stacked. The second work function control layer pattern may include a second metal layer pattern 445 and a third barrier layer pattern 455 sequentially stacked.

Referring to FIGS. 19 to 22 again, by removing the third photoresist pattern 470, a first gate structure 482a may be formed on the channel layer 370 and a portion of the isolation layer pattern 312 in the PMOS region. A second gate structure 488b may be formed on each of the active regions 306 and 308 and a portion of the isolation layer pattern 312 in the NMOS region. The first gate structure may include the gate insulation layer pattern, the first work function control layer pattern, the second work function control layer pattern, and the doped polysilicon layer pattern sequentially stacked. The second gate structure may include the gate insulation layer pattern, the second work function control layer pattern, and the doped polysilicon layer pattern sequentially stacked.

The first and second gate structures may form first to four gate lines 482, 484, 486, and 488, alone or in a combination thereof. Each of the first and second gate lines 482 and 484 extended over the PMOS region and NMOS region in the first direction may include all of the first and second gate structures. Each of the third and fourth gate lines 486 and 488 overlapping and extended over the NMOS region in the first direction may include all of the second gate structures.

A spacer layer covering the first to fourth gate lines 482, 484, 486, and 488 may be formed on the active regions 302, 304, 306, and 308. The isolation layer pattern 312, and may be etched anisotropically to form a gate spacer 490 on sidewalls of the first to fourth gate lines 482, 482, 486, and 488.

An insulating interlayer 500 may be formed on the gate lines 482, 484, 486, and 488, the gate spacer 490, and the isolation layer pattern 312. Contacts 510, 512, 514, 516, and 518 may be formed through the insulating interlayer 500 to contact the gate lines 482, 484, 486, and 488 and/or the active regions 302, 304, 306, and 308 adjacent thereto. A bit line and a word line may be formed on the insulating interlayer 500 and the contacts 510, 512, 514, 516, and 518.

The semiconductor devices and methods of manufacturing the same described herein may be used for various devices including ones with one or more PMOS transistors and/or one or more NMOS transistors. Moreover, the embodiments of the semiconductor devices and method may correspond not only as/to form devices in a memory cell region or a core/peripheral region of an SRAM device or of Dynamic Random Access Memory (DRAM) device, but also in a logic region where logic circuits may be formed.

By way of summation and review, due to the silicon-germanium layer for channel, the mismatch between the threshold voltages of transistors in the PMOS region and the NMOS region and the leakage current characteristics of the PMOS transistor may be changed. Example embodiments provide a method of manufacturing a semiconductor device including a PMOS transistor having good characteristics. Example embodiments also provide a semiconductor device including a PMOS transistor having good characteristics. A PMOS transistor including the gate structure may have an improved effect in the aspect of the decrease of the leakage current and the threshold voltage mismatch of transistors between the PMOS region and the NMOS region.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate including a PMOS region in an active region and an NMOS region in an active region, the substrate further including an isolation layer pattern between the PMOS and NMOS regions;
   a silicon-germanium channel layer on the active region in the PMOS region;
   a first gate structure over a top surface and at least one sidewall of the silicon-germanium channel layer and on a portion of the isolation layer pattern adjacent to the silicon-germanium channel layer, the first gate structure included on a groove having a bottom surface, at least a portion of the bottom surface lower than a bottom surface of the silicon-germanium channel layer; and
   a second gate structure on the active region in the NMOS region.

2. The device as claimed in claim 1, wherein the bottom surface of the groove is lower than a bottom surface of the silicon-germanium channel layer.

3. The device as claimed in claim 1, wherein the first gate structure is coupled to the second gate structure.

4. The device as claimed in claim 3, wherein:
   the first gate structure includes a gate insulation layer pattern, a first work function control layer pattern, and a second work function control layer pattern; and
   the second gate structure includes the gate insulation layer pattern, and the second work function control layer pattern.

5. The device as claimed in claim 4, wherein:
   the gate insulation layer pattern includes a low-k dielectric layer pattern and a high-k dielectric layer pattern sequentially stacked; and
   the first work function control layer pattern includes a first metal nitride layer pattern and a second metal nitride layer pattern sequentially stacked.

6. The device as claimed in claim 4, wherein the first metal nitride layer pattern includes at least one of titanium (Ti) and tantalum (Ta).

7. The device as claimed in claim 4, wherein the second metal nitride layer pattern includes at least one of titanium (Ti) and tantalum (Ta).

8. The device as claimed in claim 4, wherein the second work function control layer pattern includes a third metal nitride pattern and a metal layer pattern.

9. The device as claimed in claim 8, wherein the third metal nitride layer pattern includes at least one of titanium (Ti) and tantalum (Ta).

10. The device as claimed in claim 1, wherein:
    the first gate structure is in a pull-up transistor of a SRAM device, and
    the second gate structure is in a pull-down transistor or a pass-gate transistor of the SRAM device.

11. The device as claimed in claim 1, further comprising a spacer disposed at a sidewall of the first gate structure.

12. The device as claimed in claim 11, wherein the spacer is disposed on the groove.

13. A semiconductor device, comprising:
    a substrate including a PMOS region in an active region and an NMOS region in an active region, the substrate further including an isolation layer pattern between the PMOS and NMOS regions;
    a channel layer on the active region in the PMOS region;
    a first gate structure over a top surface and at least one sidewall of the channel layer and on a portion of the isolation layer pattern adjacent to the channel layer, the first gate structure included on a groove having a bottom surface; and
    a second gate structure on the active region in the NMOS region,
    wherein at least a portion of the bottom surface of the groove is lower than an upper surface of the isolation layer pattern,
    wherein the gate insulation layer pattern includes a low-k dielectric layer pattern and a high-k dielectric layer pattern sequentially stacked, and
    wherein the first gate structure includes a gate insulation layer pattern, a first barrier metal nitride layer pattern, and a second barrier metal nitride layer pattern.

14. The device as claimed in claim 13, wherein the bottom surface of the groove is lower than a bottom surface of the channel layer.

15. The device as claimed in claim 13, wherein the second gate structure includes the gate insulation layer pattern and a third barrier metal nitride layer pattern.

16. The device as claimed in claim 15, wherein the second gate structure is coupled to the first gate structure.

17. The device as claimed in claim 13, wherein:
    the first gate structure is in a pull-up transistor of a SRAM device, and
    the second gate structure is in a pull-down transistor or a pass-gate transistor of the SRAM device.

18. The device as claimed in claim 13, further comprising a spacer disposed at a sidewall of the first gate structure.

19. The device as claimed in claim 18, wherein the spacer is disposed on the groove.

20. A semiconductor device, comprising:
    a substrate including a PMOS region in an active region and an NMOS region in an active region, the substrate further including an isolation layer pattern between the PMOS and NMOS regions;
    a channel layer on the active region in the PMOS region;
    a first gate structure over a top surface and at least one sidewall of the channel layer and on a portion of the isolation layer pattern adjacent to the channel layer, the first gate structure included on a groove having a bottom surface; and
    a second gate structure on the active region in the NMOS region, wherein at least a portion of the bottom surface of the groove is lower than an upper surface of the isolation layer pattern and a bottom surface of the channel layer, wherein the gate insulation layer pattern includes a low-k dielectric layer pattern and a high-k dielectric layer pattern sequentially stacked, wherein the first gate structure includes a gate insulation layer pattern, a first barrier metal nitride layer pattern, and a second barrier metal nitride layer pattern, and wherein the second gate structure is coupled to the first gate structure.

* * * * *